US012777895B2

(12) United States Patent
Lin et al.

(10) Patent No.: US 12,777,895 B2
(45) Date of Patent: Oct. 27, 2026

(54) METHOD OF MANUFACTURING CIRCUIT PATTERN STRUCTURE AND MEASUREMENT METHOD

(71) Applicant: Advanced Semiconductor Engineering, Inc., Kaohsiung (TW)

(72) Inventors: Yu-Kai Lin, Kaohsiung (TW); Chih-Cheng Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 821 days.

(21) Appl. No.: 17/989,575

(22) Filed: Nov. 17, 2022

(65) Prior Publication Data

US 2024/0170345 A1 May 23, 2024

(51) Int. Cl.
*H10P 74/20* (2026.01)
*G01N 3/24* (2006.01)
*H10W 70/05* (2026.01)

(52) U.S. Cl.
CPC ............. *H10P 74/203* (2026.01); *G01N 3/24* (2013.01); *H10W 70/05* (2026.01)

(58) Field of Classification Search
CPC ........................................................ H01L 22/12
USPC ............................................................ 73/842
See application file for complete search history.

(56) References Cited

U.S. PATENT DOCUMENTS 5,773,987 A * 6/1998 Montoya ............ G01R 1/07342 324/754.2
2007/0262767 A1* 11/2007 Cooper .............. G01R 31/2886 324/73.1
2010/0288012 A1* 11/2010 Su ............................ G01N 3/24 73/842
2011/0049728 A1* 3/2011 Pagani .................... H01L 22/32 257/E21.531
2022/0165679 A1* 5/2022 Chen ................. H01L 23/49838

* cited by examiner

*Primary Examiner* — Walter L Lindsay, Jr.
*Assistant Examiner* — Philip T Fadul
(74) *Attorney, Agent, or Firm* — Foley & Lardner LLP

(57) ABSTRACT

A method of manufacturing a circuit pattern structure, a measurement method, and a circuit pattern structure are provided. The method of manufacturing the circuit pattern structure includes: forming a dielectric layer; forming at least one first pad at least partially in the dielectric layer; forming a second pad adjacent to the at least one first pad and having a height greater than that of the at least one first pad.

20 Claims, 45 Drawing Sheets

200

200

200A

METHOD OF MANUFACTURING CIRCUIT PATTERN STRUCTURE AND MEASUREMENT METHOD

BACKGROUND

1. Field of the Disclosure

The present disclosure relates to a method of manufacturing a circuit pattern structure, a measurement method, and a circuit pattern structure.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase. Thus, circuit layers with fine pitch may be needed. The adhesion between the circuit layer and dielectric layer influences the resistance and robustness of the circuit layer. However, no suitable approach is available for precisely testing such a characteristic.

SUMMARY

In some embodiments, a method of manufacturing a circuit pattern structure includes: forming a dielectric layer; forming at least one first pad at least partially in the dielectric layer; forming a second pad adjacent to the at least one first pad and having a height greater than that of the at least one first pad.

In some embodiments, a measurement method includes: providing a circuit pattern structure comprising a first pad and a second pad; and applying a force to the second pad along a path overlapping a projecting area of the first pad on a surface of the circuit pattern structure.

In some embodiments, a measurement method includes: providing a circuit pattern structure comprising a first pad and a second pad having a height greater than that of the first pad; and applying a force to the second pad along a path over the first pad to test a bonding quality of the first pad and the second pad in the circuit pattern structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
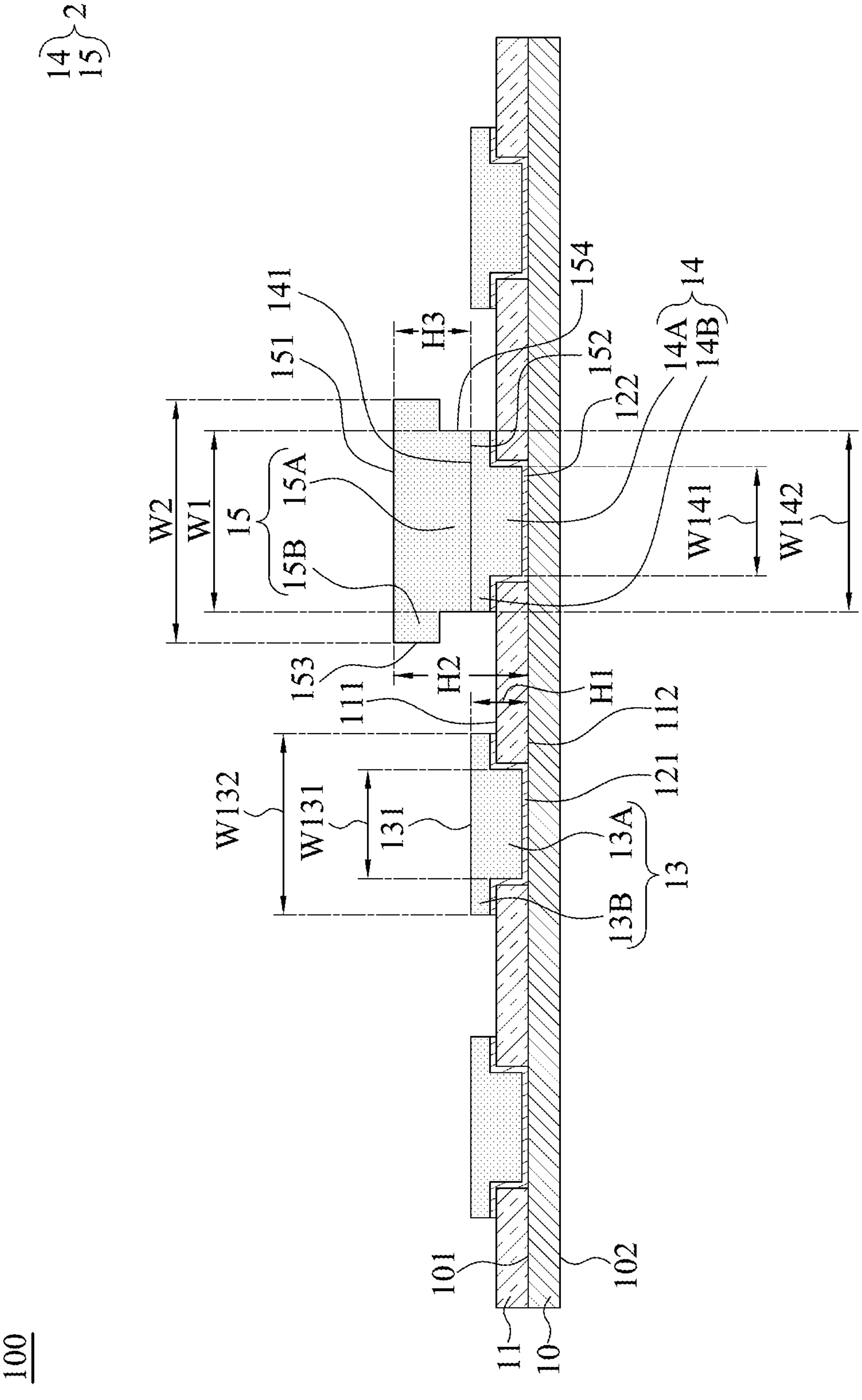
FIG. 1 illustrates a cross-sectional view of a circuit pattern structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a circuit pattern structure 100 according to some embodiments of the present disclosure. The circuit patter structure 100 includes a carrier 10, a dielectric layer (or a dielectric structure) 11, a conductive trace (an intact conductive trace or a pad) 13, and a conductive trace (an under-test conductive trace or a conductive trace to be tested, or a pad) 2.

The carrier 10 may have a surface 101 and a surface 102 opposite to the surface 101. In some embodiments, the carrier 10 may include a lead frame encapsulated by molding compounds. In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate including silicon, germanium, or other suitable materials.

The dielectric layer 11 may be disposed over the surface 101 of the carrier 10. The dielectric layer 11 may have a surface 111 facing away from the carrier 10 and a surface 112 opposite to the surface 111. The surface 112 of the dielectric layer 11 may be in contact with the surface 101 of the carrier 10. In some embodiments, a material of the dielectric layer 11 may be made of a cured photoimageable dielectric (PID) material such as epoxy or polyimide (PI) including photoinitiators. In addition, the dielectric layer 11 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive trace 13 may be disposed over the carrier 10. The conductive trace 13 may be disposed in the dielectric layer 11. The conductive trace 13 may be embedded in the dielectric layer 11. The dielectric layer 11 may define a hole or a trench for accommodating the conductive trace 13. The conductive trace 13 may include a surface (a top surface) 131 facing away from the dielectric layer 11. In some embodiments, the surface 131 of the conductive trace 13 may be at an elevation higher than the surface 111 of the dielectric layer 11 relative to the carrier 10. The circuit pattern structure 100 may further include a seed layer 121 disposed between the conductive trace 13 and the carrier 10 or between the conductive trace 13 and the dielectric layer 11. The seed layer 121 may be disposed along a sidewall of the conductive trace 13. The surface 131 of the conductive trace 13 may be free from being in contact with the seed layer 121. The dielectric layer 11 may be disposed below the seed layer 12.

The conductive trace 13 may have a "T" shape in a cross-sectional view. The conductive trace 13 may include a portion 13A and a portion 13B disposed over the portion 13A. The portion 13A may be disposed in the hole or the trench of the dielectric layer 11. The portion 13B may be disposed over the surface 111 of the dielectric layer 11. The portion 13A may have a width W131 and the portion 13B may have a width W132. The width W132 of the portion 13B may be greater than the width W131 of the portion 13A. The portion 13A and the portion 13B may be formed concurrently and integrally as a monolithic structure.

The conductive trace 13 may include conductive materials, such as copper (Cu), tin (Sn), aluminum (Al), gold (Au), silver (Ag), tungsten (W), nickel (Ni), or other suitable materials. The seed layer 121 may include copper (Cu), titanium (Ti), tin (Sn), stainless steel, another metal or metal alloy, or a combination thereof.

The conductive trace 2 may be disposed over the carrier 10. A portion of the conductive trace 2 may be surrounded by the dielectric layer 11. The conductive trace 2 may be surrounded by plurality of conductive traces 13. The conductive trace 2 may be disposed between two conductive traces 13. The conductive trace 2 may include a conductive trace (or a pad) 14 and a protrusion portion (or a pad) 15. The conductive trace 14 may be referred to as an under-test conductive trace. The conductive trace 13 and the conductive trace 2 may be collectively referred to as a redistribution layer (RDL).

The conductive trace 14 may be disposed over the carrier 10. The conductive trace 14 may be disposed in the dielectric layer 11. The conductive trace 14 may be embedded in the dielectric layer 11. The dielectric layer 11 may define a hole or a trench for accommodating the conductive trace 14. The conductive trace 14 may include a surface (a top surface) 141 facing away from the dielectric layer 11. In some embodiments, the surface 141 of the conductive trace 14 may be at an elevation higher than the surface 111 of the dielectric layer 11 relative to the carrier 10. The circuit pattern structure 100 may further include a seed layer 122 disposed between the conductive trace 14 and the carrier 10 or between the conductive trace 14 and the dielectric layer 11. The seed layer 122 may be disposed along a sidewall of the conductive trace 14. The surface 141 of the conductive trace 14 may be free from being in contact with the seed layer 122.

The conductive trace 14 may have a "T" shape in a cross sectional view. The conductive trace 14 may include a portion 14A and a portion 14B disposed over the portion 14A. The portion 14A may be disposed in the hole or the trench of the dielectric layer 11. The portion 14B may be disposed over the surface 111 of the dielectric layer 11. The portion 14A may have a width W141 and the portion 14B may have a width W142. The width W142 of the portion 14B may be greater than the width W141 of the portion 14A. The portion 14A and the portion 14B may be formed concurrently and integrally as a monolithic structure or a one-piece structure.

The conductive trace 14 may include conductive materials, such as copper (Cu), tin (Sn), aluminum (Al), gold (Au), silver (Ag), tungsten (W), nickel (Ni), or other suitable materials. The protrusion portion 15 may include conductive materials, such as copper (Cu), tin (Sn), aluminum (Al), gold (Au), silver (Ag), tungsten (W), nickel (Ni), or other suitable materials. The seed layer 122 may include copper (Cu), titanium (Ti), tin (Sn), stainless steel, another metal or metal alloy, or a combination thereof.

The protrusion portion 15 may be disposed over the conductive trace 14. The protrusion portion 15 may have a surface (or a top surface) 151 facing away from the surface 141 of the conductive trace 14 and a surface 152 opposite to the surface 151. The surface 152 of the protrusion portion 15 may be in contact with the surface 141 of the conductive trace 14. The protrusion portion 15 may have a "T" shape in a cross-sectional view. The protrusion portion 15 may include a segment 15A and a segment 15B disposed over the segment 15A. The segment 15A and the segment 15B may be connected. The segment 15A and the segment 15B may be formed in one piece. The segment 15A may have a width W1 and the segment 15B may have a width W2. The width W2 may be different from the width W1. The width W2 may be greater than the width W1. The segment 15A may have a plurality of lateral surfaces 154 extending from the surface 152 of the protrusion portion 15. The width W1 is defined by the lateral surfaces 154 of the segment 15A. The segment 15B may have a plurality of lateral surfaces 153 extending from the surface 151 of the protrusion portion 15. The width W2 is defined by the lateral surfaces 153 of the segment 15B. The width W1 of the segment 15A of the protrusion portion 15 and the width W142 of the portion 14B of the conductive trace 14 may be substantially the same. The width W1 of the segment 15A of the protrusion portion 15 may be different from the width W142 of the portion 14B of the conductive trace 14. The protrusion portion 15 may be in different shapes; for example, a rectangular shape, a reverse-T shape, or the like. In some embodiments, the interface (i.e., the surface 141 of the conductive trace 14) between the conductive trace 14 and the protrusion portion 15 may be omitted. That is, the conductive trace 14 and the protrusion portion 15 may be formed concurrently and integrally as a monolithic structure or a one-piece structure.

The top surface 151 of the protrusion portion 15 (or the conductive trace 2) and the top surface 131 of the conductive trace 13 may be at different elevations. The top surface 131 of the conductive trace 13 may have a height H1 relative to the surface 101 of the carrier 10. The top surface 151 of the conductive trace 2 may have a height H2 relative to the surface 101 of the carrier 10. The heights H1 and H2 may be different. The height H2 of the top surface 151 may be greater than the height H1 of the top surface 131. Furthermore, the protrusion portion 15 may have a height H3. The height H2 may equal to the sum of the height H1 and the height H3.

The top surface 131 of the conductive trace 13 and the top surface 141 of the conductive trace 14 may be at the same elevation. The protrusion portion 15 may be configured to increase the height of the conductive trace 2. The conductive trace 2 may be used for the test of the adhesion quality between the dielectric layer 11 and the conductive trace 2. The adhesion quality therebetween may represent the conductive traces (e.g., the conductive traces 13) of the circuit pattern structure 100. The adhesion test may include several steps, which will be discussed later, to apply a force to the conductive trace 2 through a probe and detect a shear stress from the conductive trace 2 through the probe. The shear stress may be represented by reaction force detected by the probe 50. The conductive trace 2 with an elevated structure facilitates the adhesion test. In other words, the probe in the adhesion test may be applied to the conductive trace 2 without touching the conductive traces (e.g., the conductive traces 13) and/or the dielectric layer 11. The height difference between the under-test conductive trace 2 and other conductive traces enables a probe to apply the force to the under-test conductive trace 2 without colliding with the other conductive traces. The higher elevation of the under-test conductive trace 2 provides more space between a probe and the dielectric layer 11 to prevent the collision between the probe and the dielectric layer 11.

In some embodiments, the conductive trace 13 may be a first pad. In some embodiments, the conductive trace 2 may be a second pad. In some embodiments, the protrusion portion 15 may be a second pad. In some embodiments, the conductive trace 14 may be a third pad.

Figure 2:
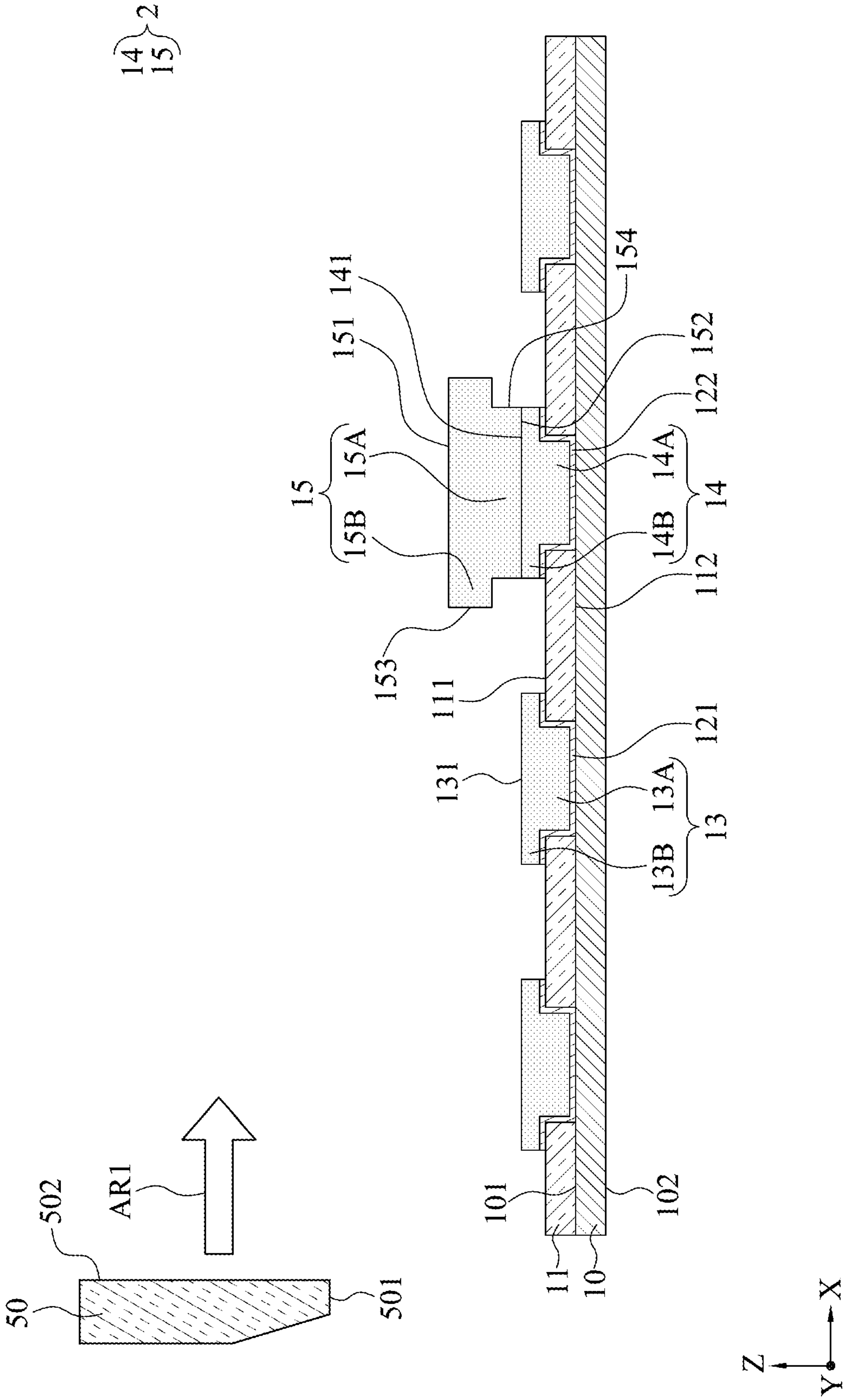
FIG. 2 illustrates one or more stages of an example of a testing method for a circuit pattern structure according to some embodiments of the present disclosure.

FIG. 2 illustrates one or more stages of an example of a testing method (or a measurement method, interchangeable in the following paragraphs) for a circuit pattern structure (e.g., the circuit pattern structure 100) according to some embodiments of the present disclosure. As shown in FIG. 2, a probe 50 may have a movement AR1 in a direction X. The probe 50 may be moved, with respect to the circuit pattern structure 100, over the conductive trace 13. The probe 50 may be controlled by an actuator. In some embodiments, the movement AR1 may include a movement in a direction Y or Z. The probe 50 may move toward the conductive trace 2, but there is still a relatively large distance between the probe 50 and the conductive trace 2. The probe 50 may approach the circuit pattern structure 100 in the movement AR1. At the beginning, the probe 50 may be positioned at an elevation higher than the top surface 151 of the protrusion portion 15, such that it will not be in contact with the circuit pattern structure 100 during the movement AR1. The probe 50 may have a substantially flat lateral surface 502, which is a surface for applying force. In some embodiments, the circuit pattern structure 100 may be moved with respect to the probe 50 by a holder.

Figure 3:
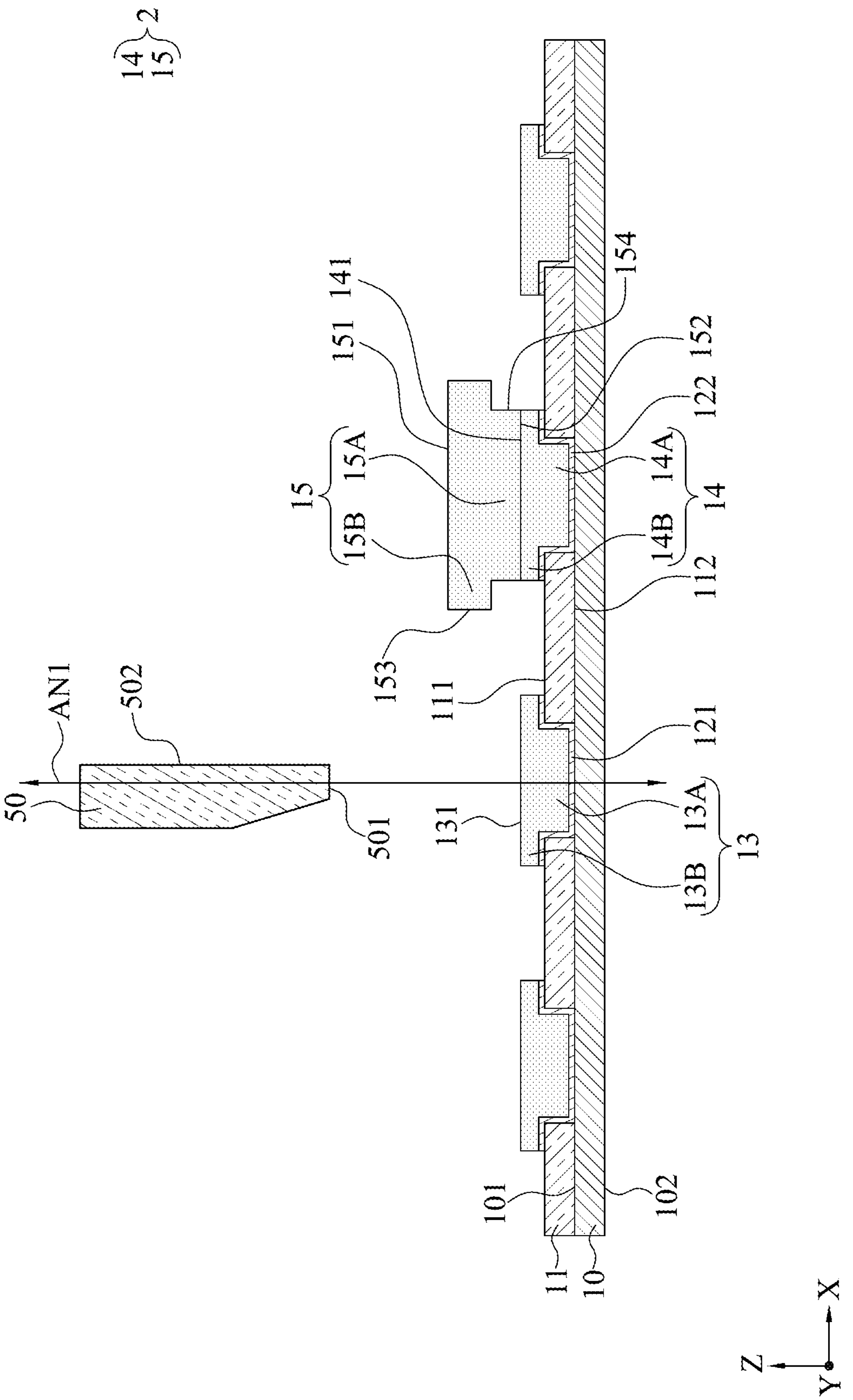
FIG. 3 illustrates one or more stages of an example of a testing method for a circuit pattern structure according to some embodiments of the present disclosure.

FIG. 3 illustrates one or more stages of an example of a testing method for a circuit pattern structure (e.g., the circuit pattern structure 100) according to some embodiments of the present disclosure. As shown in FIG. 3, after the movement AR1, the probe 50 may be moved in a position substantially aligned with an intact conductive trace (e.g., the conductive trace 131) near the conductive trace 2 in an axis AN1. In some embodiments, the probe 50 may be moved in a position substantially aligned with the dielectric layer 11 between the intact conductive traces or between the intact conductive trace and the under-test conductive trace (e.g., the conductive trace 2).

Figure 4:
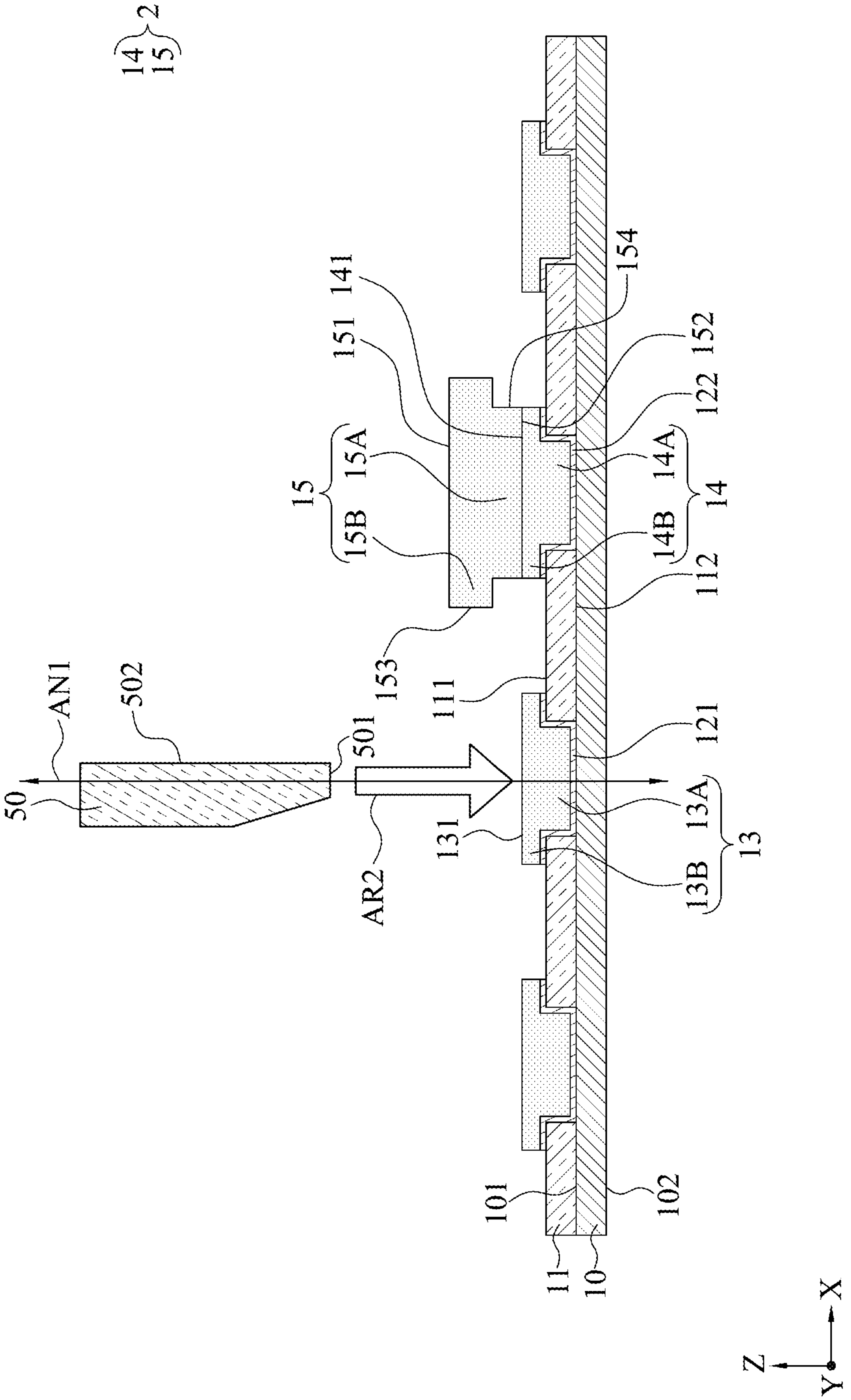
FIG. 4 illustrates one or more stages of an example of a testing method for a circuit pattern structure according to some embodiments of the present disclosure.

FIG. 4 illustrates one or more stages of an example of a testing method for a circuit pattern structure (e.g., the circuit pattern structure 100) according to some embodiments of the present disclosure. As shown in FIG. 4, the probe 50 may have a movement AR2 in a direction Z, perpendicular to the surface 101 of the carrier 10. The movement AR2 may be in the axis AN1. The probe 50 may move toward the conductive trace 13 in the movement AR2. The movement AR2 may be performed after the movement AR1.

Figure 4A:
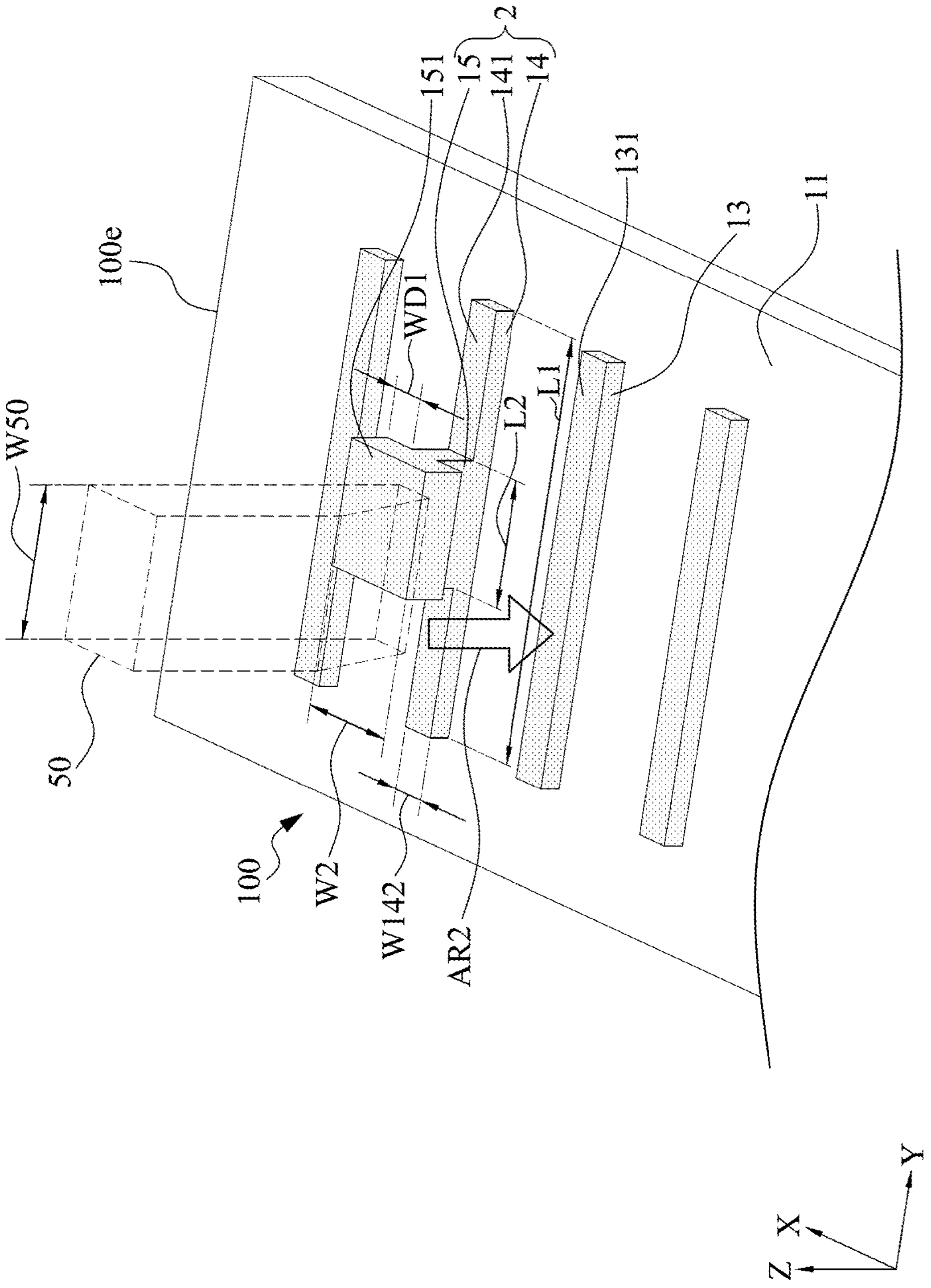
FIG. 4A illustrates one or more stages of an example of a testing method for a circuit pattern structure in 3D view according to some embodiments of the present disclosure.

FIG. 4A illustrates one or more stages of an example of a testing method for a circuit pattern structure (e.g., the circuit pattern structure 100) in 3D view according to some embodiments of the present disclosure. In some embodiments, the stages of the testing method of FIG. 4A may correspond to those of FIG. 4.

As shown in FIG. 4A, the conductive trace 2 may be disposed at an edge 100*e* of the circuit pattern structure 100. A width difference WD1 between the width W2 of the protrusion portion 15 and the width W142 of the conductive trace 14 may be the basis of determining the movement AR2. In some embodiments, the movement AR2 may have a distance that is multiple of the width difference WD1. For example, the width difference WD1 may be 1 μm and the distance of the movement AR2 may be ten times of the width difference WD1, i.e., 10 μm. In some embodiments, the actuator of the probe 50 may be electrically connected to a controller which controls the actuator of the probe 50 based on the detection signals (provided by a detector) associated with the width difference WD1.

In some embodiments, the width W2 may be the basis of determining the movement AR2. The probe 50 may be lowered based on the width W2 of the top surface 151 of the protrusion portion 15. In some embodiments, the movement AR2 may have a distance associated with the width W2 of the protrusion portion 15. For example, the width W2 may be 10 μm and the distance of the movement AR2 may be 10 μm.

As shown in FIG. 4A, the conductive trace 14 of the conductive trace 2 may have a long side having a length L1. The long side of the conductive trace 14 also refer to the symbol L1 for brevity. The protrusion portion 15 of the conductive trace 2 may have a long side having a length L2. The long side of the conductive trace 15 also refer to the symbol L2 for brevity. The length L2 of the protrusion portion 15 may be shorter than the length L1 of the conductive trace 14. In some embodiments, the length L2 may be the basis of determining the movement AR2. In some embodiments, the movement AR2 may have a distance associated with the length L2 of the protrusion portion 15. For example, the width L2 may be 10 μm and the distance of the movement AR2 may be 10 μm.

The probe 50 may be moved based on the characteristics of the under-test conductive trace 2, e.g., the width difference, width, or length. A tool including the probe 50 may have a detector configured to detect the characteristics of the under-test conductive trace 2 and a controller configured to control the movement (e.g., the movement AR2) of the probe 50 based on the detected signal from the detector. The tool may automatically identify the characteristics of the under-test conductive trace 2 and control the actuator of the probe 50, accordingly. For example, the width L2 of the under-test conductive trace 2 may be 10 μm and the distance of the movement AR2 may be 10 The automation avoids an error or offset induced by manual setting.

The detector of the tool may detect the distance between the end 501 of the probe 50 and the dielectric layer 11 during the movement (e.g., the movement AR2) of the probe 50. For example, once the detected distance reaches 10 μm, the controller may stop the movement (e.g., the movement AR2) of the probe 50.

Figure 5:
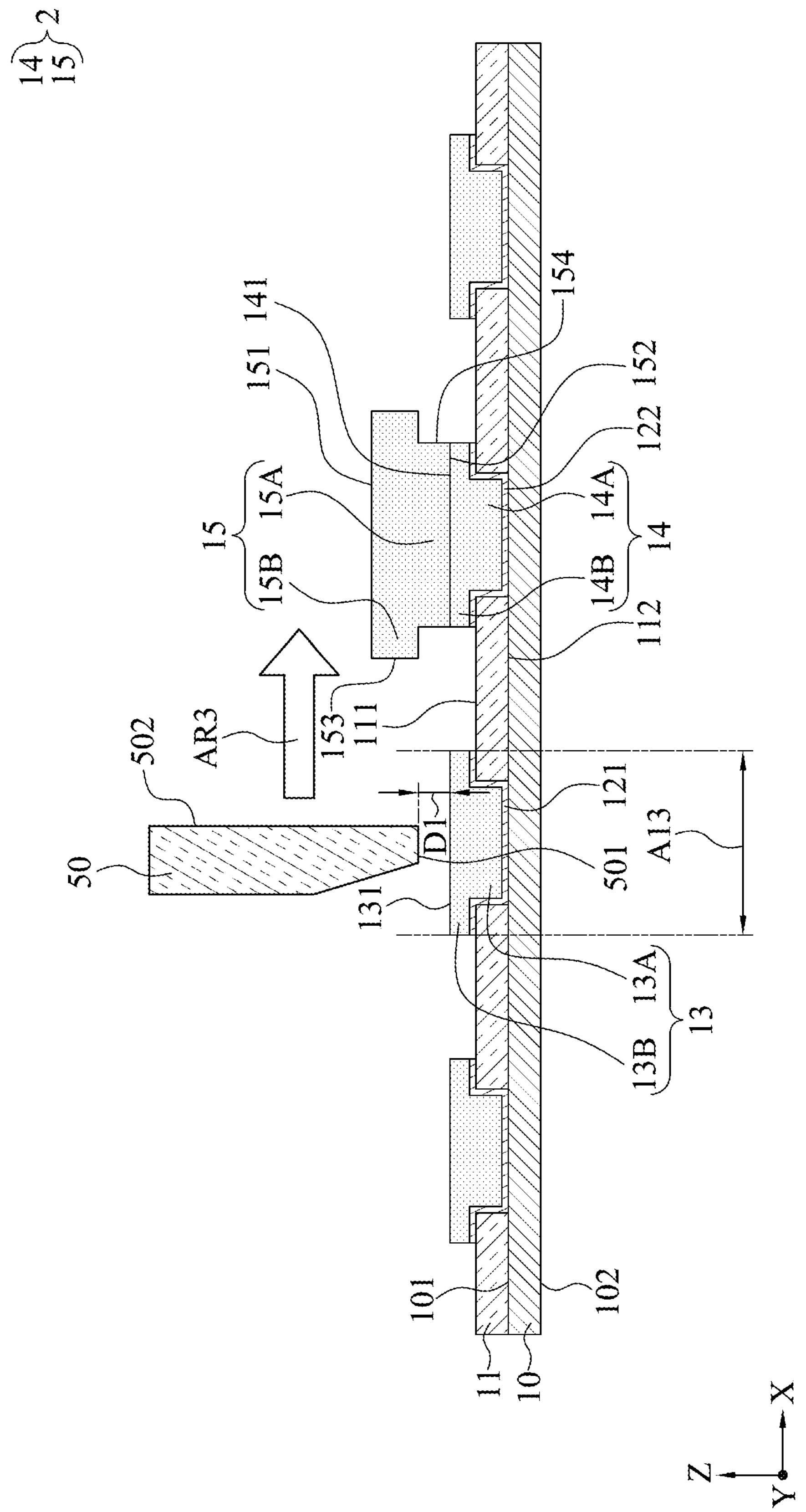
FIG. 5 illustrates one or more stages of an example of a testing method for a circuit pattern structure according to some embodiments of the present disclosure.

FIG. 5 illustrates one or more stages of an example of a testing method for a circuit pattern structure (e.g., the circuit pattern structure 100) according to some embodiments of the present disclosure. The conductive trace 13 may have a projecting area A13 on the surface 102 of the circuit pattern structure 100. In the movement AR1, the probe 50 may be moved into the projecting area A13 of the conductive trace (e.g., the pad) 13. As shown in FIG. 5, after the movement AR2, the probe 50 may be close to the conductive trace 13. The end 501 of the probe 50 may be lowered to be lower than the surface 151 of the protrusion portion 15 (or the conductive trace 2). The probe 50 may be moved, with respect to the circuit pattern structure 100, such that the end 501 may be at a position between the surface 151 of the protrusion portion 15 and the surface 131 of the conductive trace 13. There may be a distance D1 between the probe 50 and the top surface 131 of the intact conductive trace 13. The intact conductive trace 13 may be free from being in contact with the probe 50. A bottom end 501 of the probe 50 may be lower than the top surface 151 of the protrusion portion 15 of the conductive trace 2.

Figure 5A:
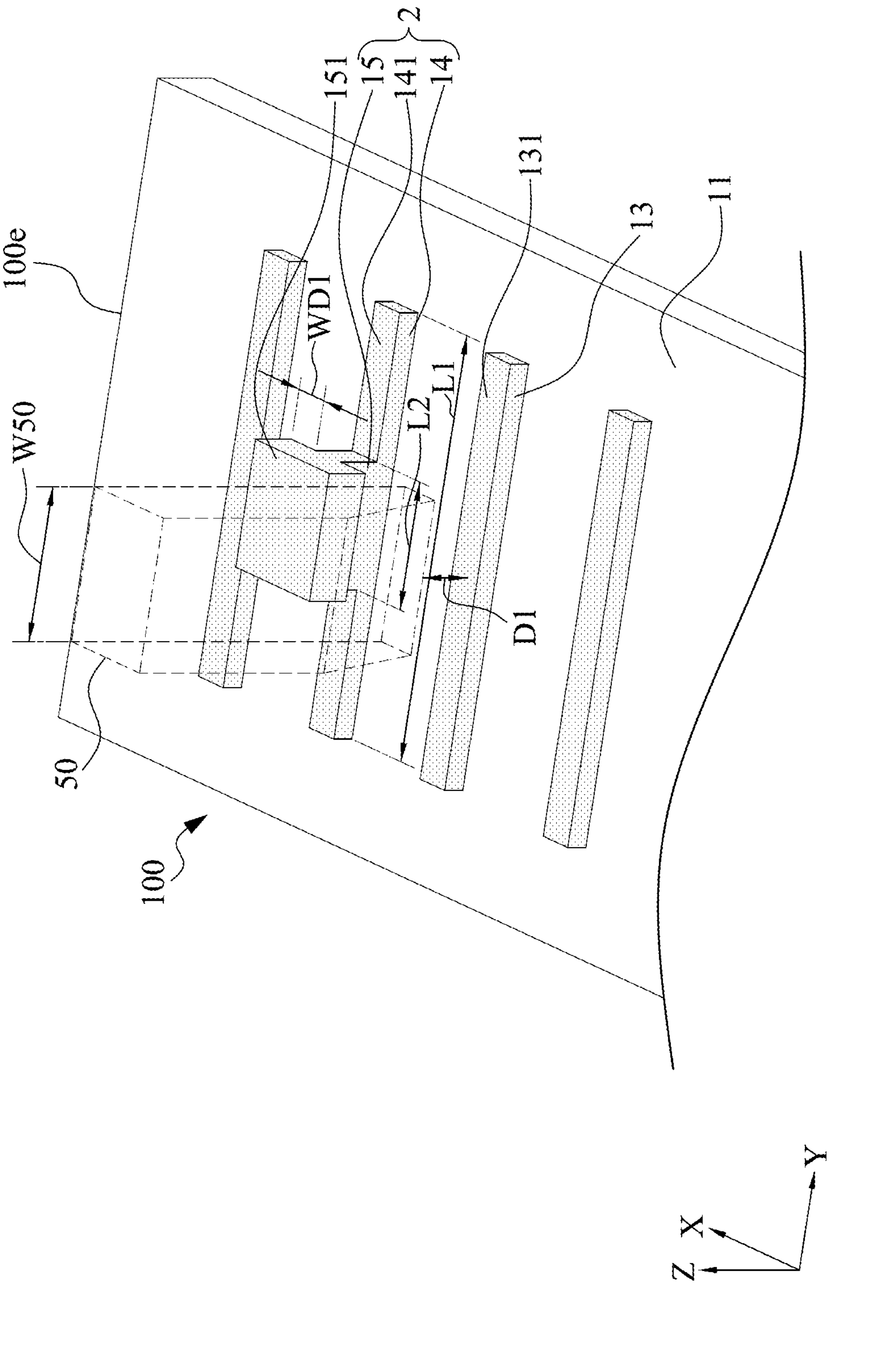
FIG. 5A illustrates one or more stages of an example of a testing method for a circuit pattern structure in 3D view according to some embodiments of the present disclosure.

FIG. 5A illustrates one or more stages of an example of a testing method for a circuit pattern structure (e.g., the circuit pattern structure 100) in 3D view according to some embodiments of the present disclosure. In some embodiments, the stages of the testing method of FIG. 5A may correspond to those of FIG. 5.

As shown in FIG. 5A, the probe 50 may be separated from the conductive trace 13 (or the surface 131) with the distance D1. The distance D1 may be determined based on the width difference WD1 between the width W2 of the protrusion portion 15 and the width W142 of the conductive trace 14. In some embodiments, the distance D1 may be multiple of the width difference WD1. For example, the width difference WD1 may be 1 μm and the distance D1 may be ten times of the width difference WD1, i.e., 10 μm. In some embodiments, the actuator of the probe 50 may be electrically connected to a controller which controls the actuator of the probe 50 based on the detection signals (provided by a detector) associated with the width difference WD1. In some embodiments, a distance between the dielectric layer 11 and the probe 50 may be determined based on the width difference WD1.

In some embodiments, the distance D1 may be determined based on the length L2 of the protrusion portion 15. For example, the length L2 may be 10 μm and the distance of the movement AR2 may be 10 μm. In some embodiments, the distance D1 may be determined based on the width W2 of the protrusion portion 15. For example, the width W2 may be 10 μm and the distance of the movement AR2 may be 10 μm. In some embodiments, a distance between the dielectric layer 11 and the probe 50 may be determined based on the width W2 or the length L2.

Referring again to FIG. 5, the probe 50 may have a movement AR3 in the direction X different from the direction Z. The probe 50 may move toward the under-test conductive trace 2 in the movement AR3. The probe 50 may maintain the same elevation during the movement AR3. In other words, the distance between the probe 50 and the top surface 131 of the conductive trace 13 may be maintained to D1. The probe 50 may move over the intact conductive trace 13 in the direction X. In some embodiments, the probe 50 may move over the intact conductive trace 13 in another direction, e.g., the direction Y or the direction Z. The probe 50 may move toward the under-test conductive trace 2 in the movement AR3 until the probe 50 reaches the lateral surface 153 of the protrusion portion 15. The top surface 131 of the intact conductive trace 13 and the top surface 151 of the conductive trace 2 may be at different elevations. As such, the probe 50 would not touch or damage the intact conductive trace 13, e.g., in the movement AR3.

Figure 6:
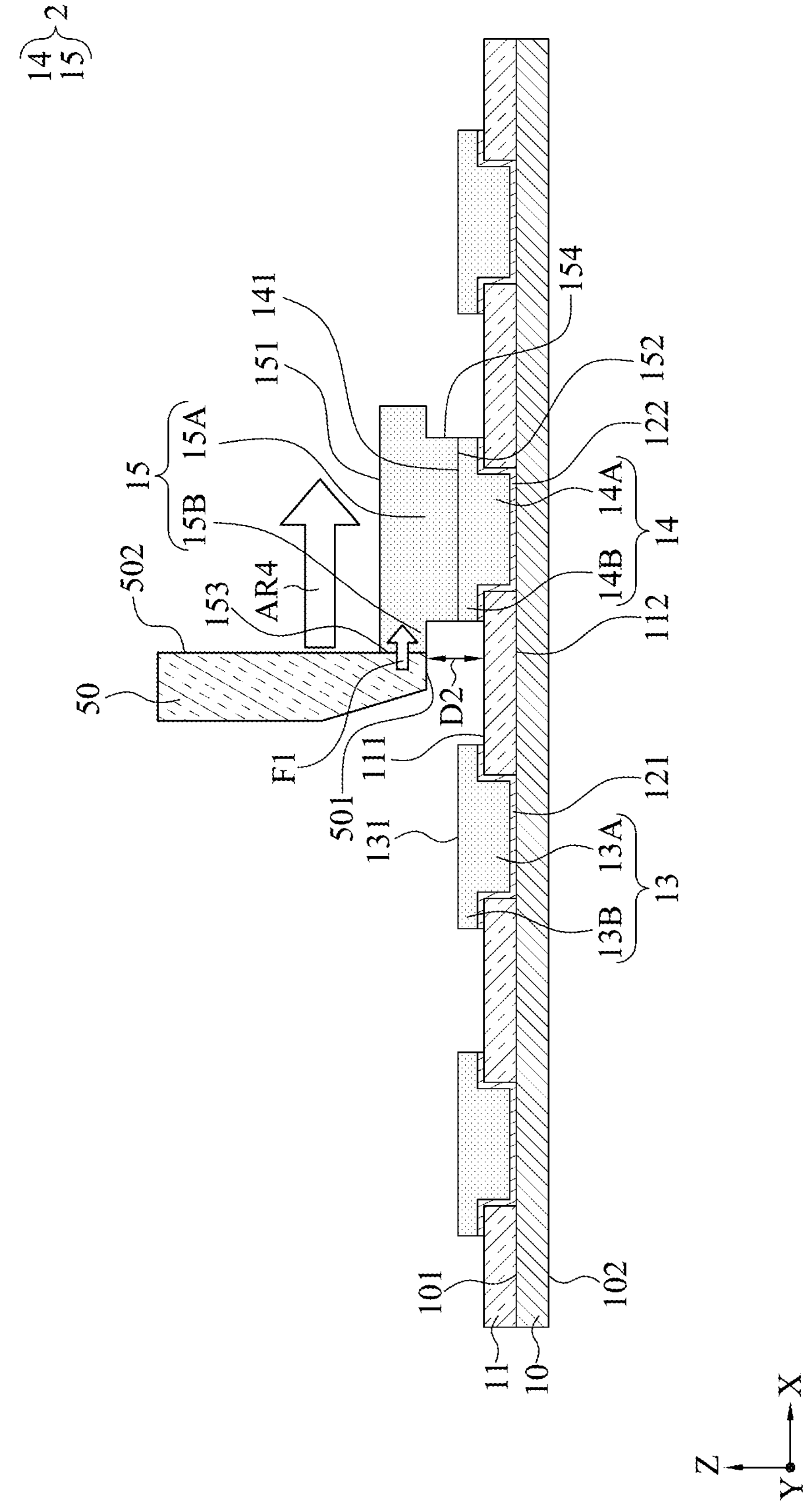
FIG. 6 illustrates one or more stages of an example of a testing method for a circuit pattern structure according to some embodiments of the present disclosure.

FIG. 6 illustrates one or more stages of an example of a testing method for a circuit pattern structure (e.g., the circuit pattern structure 100) according to some embodiments of the present disclosure. As shown in FIG. 6, after the movement AR3, the probe 50 may touch the lateral surface 153 of the protrusion portion 15 of the conductive trace 2. The probe 50 may apply a force F1 to the lateral surface 153 of the protrusion portion 15 of the conductive trace 2. The force F1 may be applied to the conductive trace 2 along a path of the movement AR3 overlapping the projecting area A13 of the conductive trace 13. The force F1 may be applied to the conductive trace 2 to test a bonding quality of the conductive trace 2 in the circuit pattern structure. The bonding quality of the conductive trace 2 may be associated with the bonding quality of the conductive trace 13. Thus, by applying the force F1 to the conductive trace 2 may test the bonding quality of the conductive trace 13 and the conductive trace 2. The path of the movement AR3 may have a direction substantially parallel to the surface 131 of the conductive trace 13. Thus, the probe 50 may not touch the conductive trace 13 or the dielectric layer 11 during the movement AR3. The probe 50 may have a movement AR4 to push the conductive trace 2, in the direction X. The movements AR3 and AR4 may be substantially parallel with each other. The movements AR3 and AR4 may be substantially at the same elevation. The movements AR3 and AR4 may be continuous. There may be a distance D2 between the probe 50 and the surface 111 of the dielectric layer 11. In other words, the dielectric layer 11 may be free from being in contact with the probe 50. The dielectric layer 11 would not be damaged by the probe 50 in the movement AR3. The probe 50 may be moved (i.e., the movement AR4) to push the lateral surface 153 of the under-test conductive trace 2 to rupture at least a portion of the under-test conductive trace 2. Different conditions will be discussed in the embodiments of FIGS. 7, 8, 9, and 10. The bonding quality may be defined as the force F1 when the conductive trace 2 is ruptured.

In some comparative embodiments, a probe may be used to push a solder bump with a round shape. However, it may be difficult to align with the round solder bump. In the present disclosure, the lateral surface 153 of the protrusion portion 15 may be substantially flat. The substantially flat lateral surface 153 facilitates the alignment of the probe 50 in the testing method to avoid contacting the dielectric layer 11. Furthermore, the substantially flat lateral surface 153 provides relatively large contact area, such that the probe 50 may efficiently apply the force (e.g., the force F1) onto the conductive trace 2, which will assist the pushing procedure of the testing method of the present disclosure.

Figure 6A:
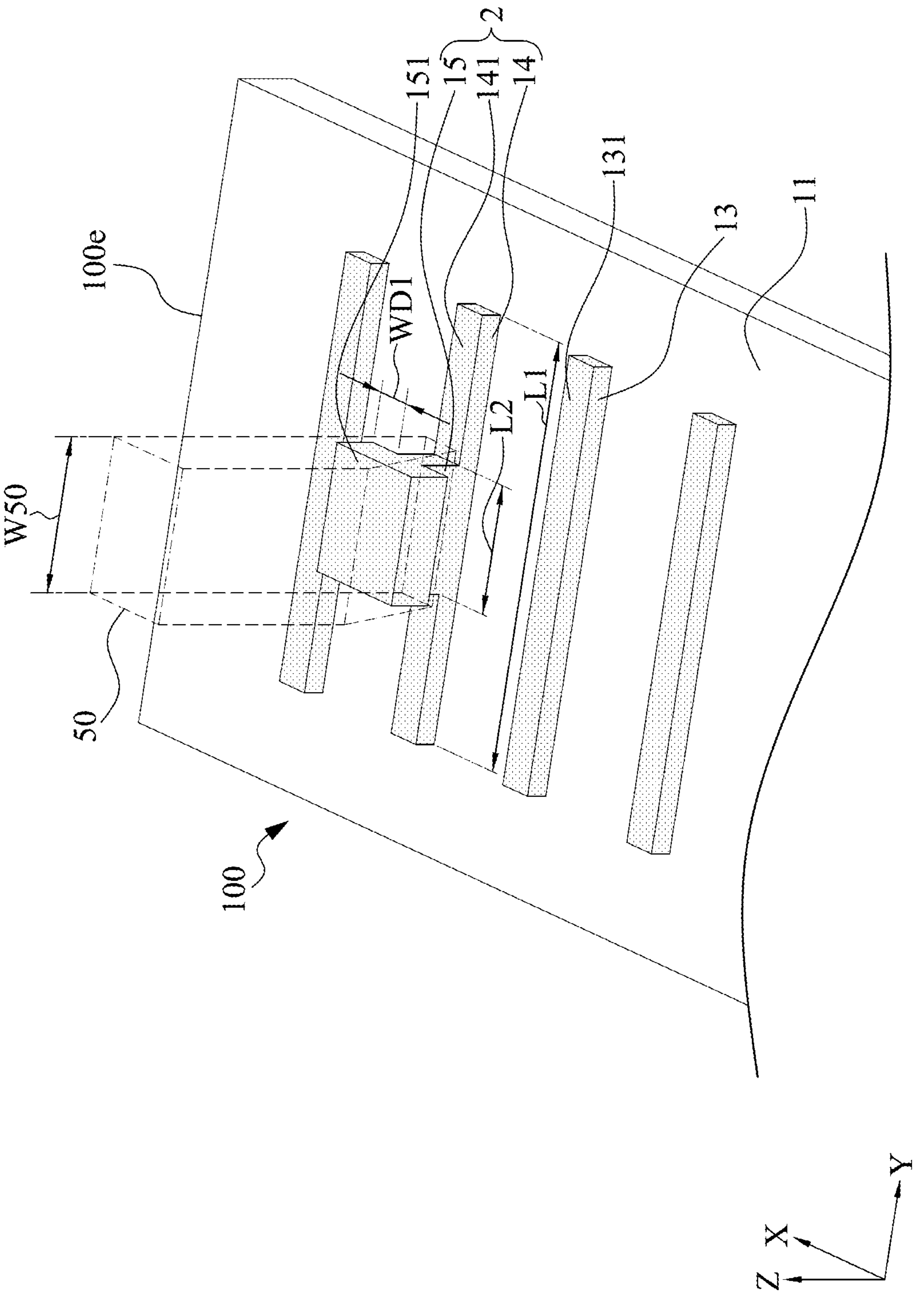
FIG. 6A illustrates one or more stages of an example of a testing method for a circuit pattern structure in 3D view according to some embodiments of the present disclosure.

FIG. 6A illustrates one or more stages of an example of a testing method for a circuit pattern structure (e.g., the circuit pattern structure 100) in 3D view according to some embodiments of the present disclosure. In some embodiments, the stages of the testing method of FIG. 6A may correspond to those of FIG. 6.

The probe 50 may push the long side L2 of the protrusion portion 15 in direction X. The probe 50 may have a width W50 substantially the same as the length L2 of the protrusion portion 15. In some embodiments, the probe 50 may be wider than the length L2 of the protrusion portion 15. The relatively large contact area between the probe 50 and the protrusion portion 15 facilitates the pushing procedure of the testing method.

Figure 6B:
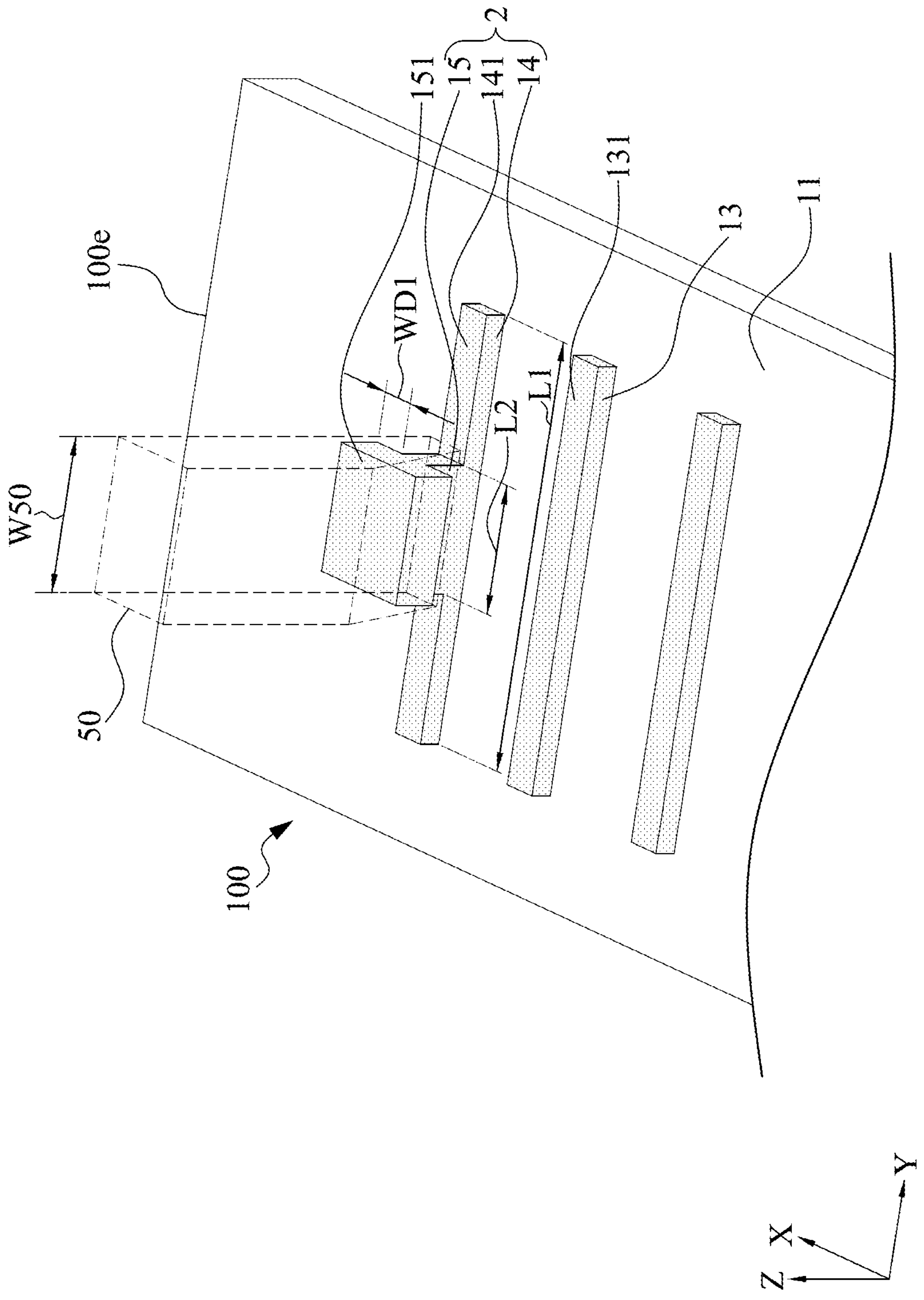
FIG. 6B illustrates one or more stages of an example of a testing method for a circuit pattern structure in 3D view according to some embodiments of the present disclosure.

FIG. 6B illustrates one or more stages of an example of a testing method for a circuit pattern structure (e.g., the circuit pattern structure 100) in 3D view according to some embodiments of the present disclosure. In some embodiments, FIG. 6B may be similar to FIG. 6A, except that the conductive trace 2 is closer to an edge 100*e* of the circuit pattern structure 100 than the at least one conductive traces 13 is. As such, the ruptured portion of the conductive trace 2 will not contact the intact conductive traces 13. Furthermore, since the under-test conductive trace 2 is at the edge 100*e*, the probe 50 is free from touching the other conductive traces during the movement (e.g., the movement AR3, AR4).

Figure 7:
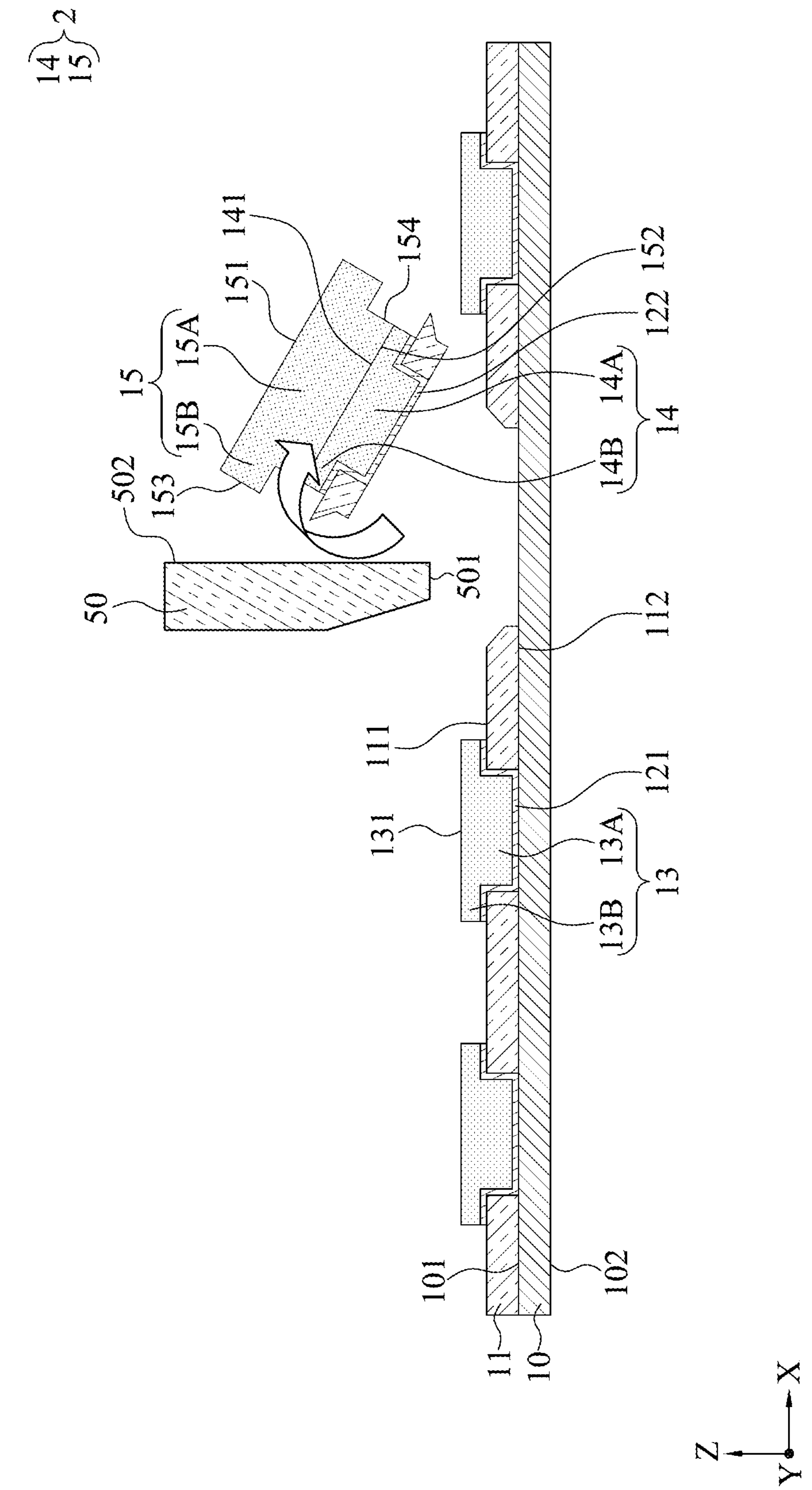
FIG. 7 illustrates one or more stages of an example of a testing method for a circuit pattern structure according to some embodiments of the present disclosure.

FIG. 7 illustrates one or more stages of an example of a testing method for a circuit pattern structure (e.g., the circuit pattern structure 100) according to some embodiments of the present disclosure. As shown in FIG. 7, the probe 50 may be moved to push the lateral side 153 of the under-test conductive trace 2 to rupture at least a portion of the dielectric layer 11 surrounding the under-test conductive trace 2. The probe 50 may be moved to push the lateral surface 153 of the under-test conductive trace 2 to remove the conductive trace 2 and at least a portion of the seed layer 122 along with the ruptured portion of the dielectric layer 11. The probe 50 may be configured to detect a shear stress when the under-test conductive trace 2 is removed and the at least portion of the dielectric layer 11 is ruptured.

Figure 8:
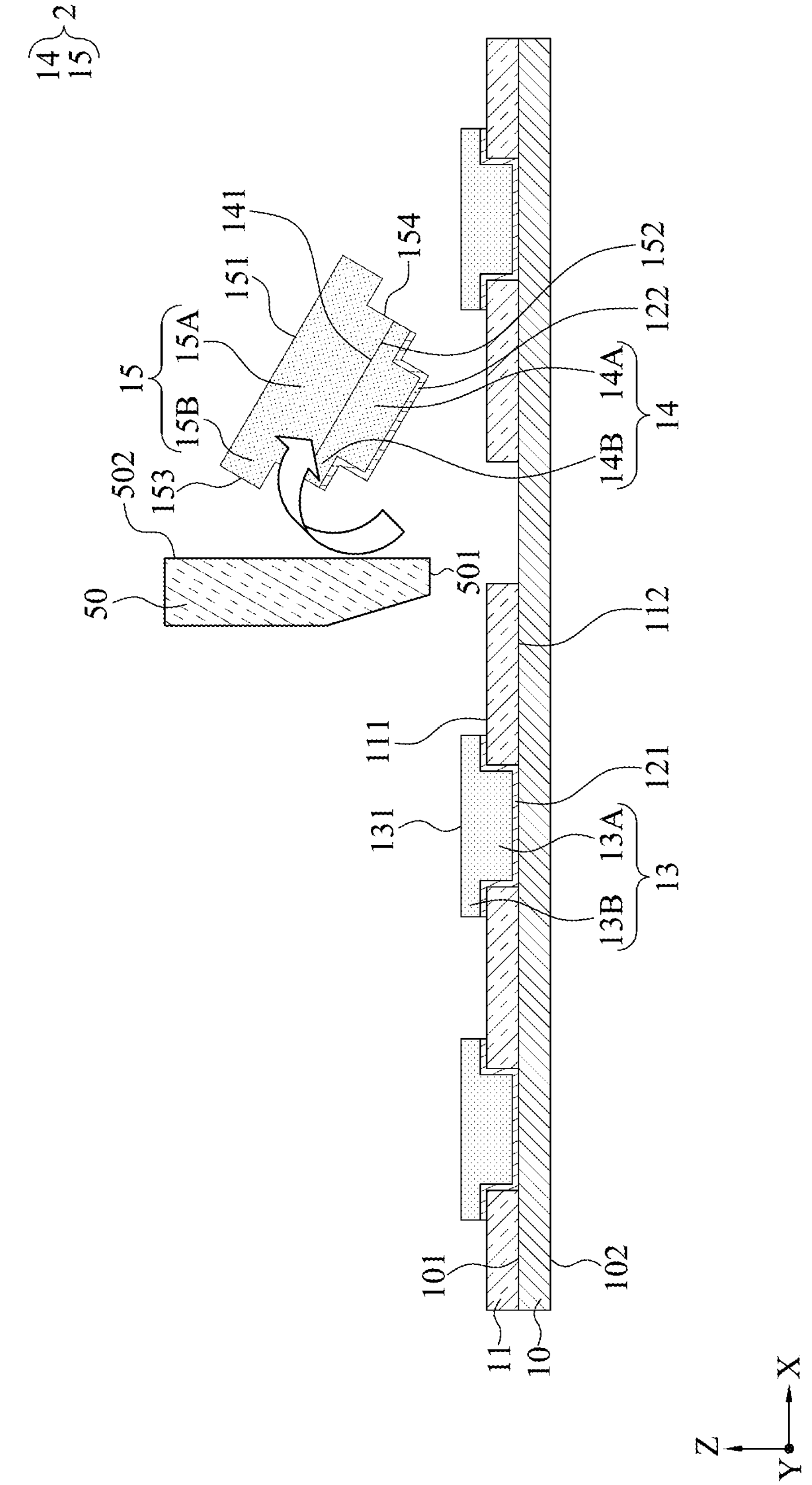
FIG. 8 illustrates one or more stages of an example of a testing method for a circuit pattern structure according to some embodiments of the present disclosure.

FIG. 8 illustrates one or more stages of an example of a testing method for a circuit pattern structure (e.g., the circuit pattern structure 100) according to some embodiments of the present disclosure. As shown in FIG. 8, the probe 50 may be moved to push the lateral surface 153 of the under-test conductive trace 2 to rupture at least a portion of the seed layer 122 surrounding the under-test conductive trace 2. The probe 50 may be moved to push the lateral surface 153 of the under-test conductive trace 2 to remove the conductive trace 2 along with the seed layer 122. The seed layer 122 may be separated from the dielectric layer 11. The probe 50 may be configured to detect a shear stress when the under-test conductive trace 2 is removed and the at least portion of the seed layer 122 is ruptured.

Figure 9:
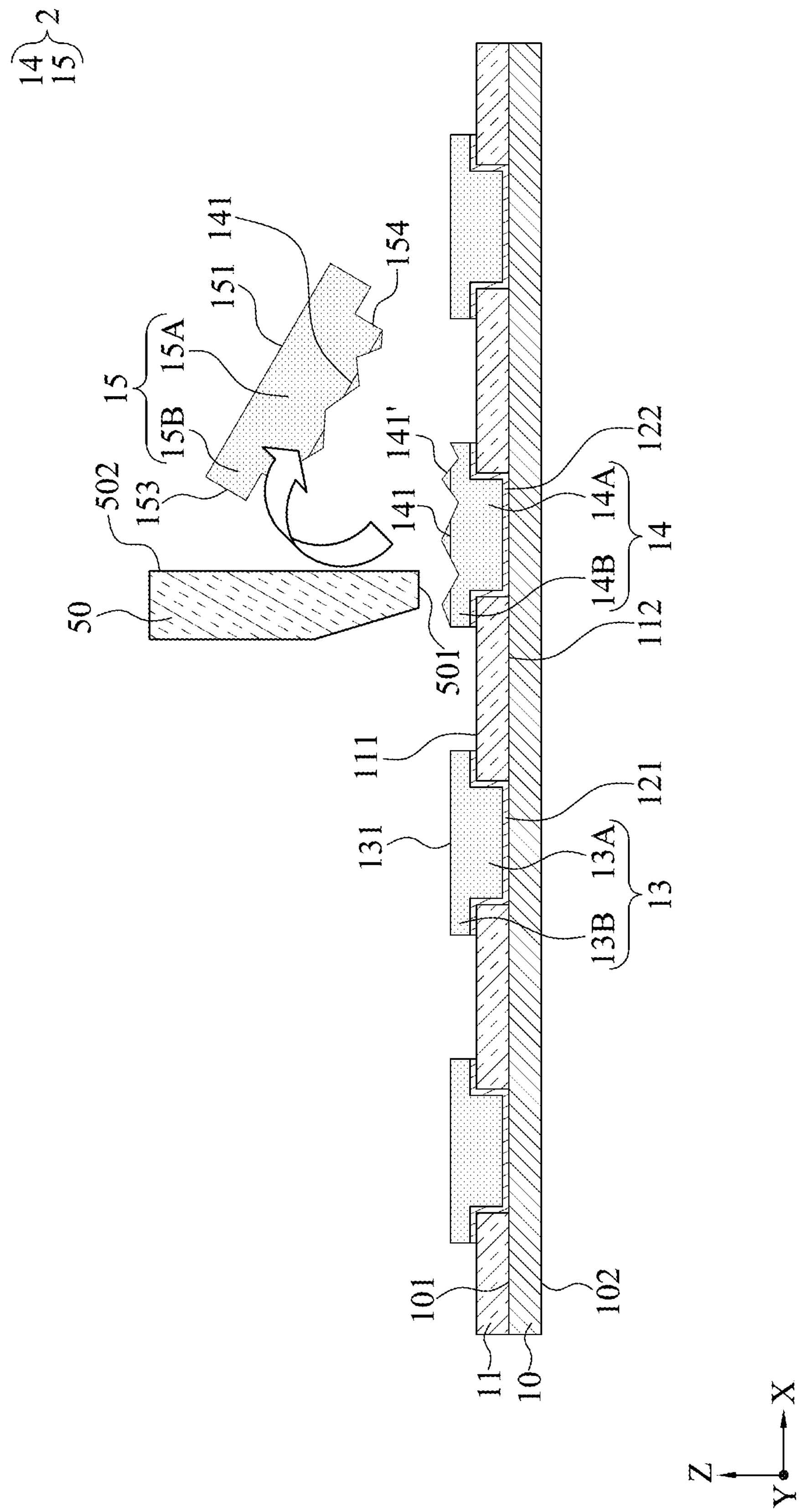
FIG. 9 illustrates one or more stages of an example of a testing method for a circuit pattern structure according to some embodiments of the present disclosure.

FIG. 9 illustrates one or more stages of an example of a testing method for a circuit pattern structure (e.g., the circuit pattern structure 100) according to some embodiments of the present disclosure. As shown in FIG. 9, the probe 50 may be moved to push the lateral surface 153 of the under-test conductive trace 2 to rupture at least a portion of the under-test conductive trace 2. After the under-test conductive trace 2 is ruptured, the under-test conductive trace 2 may have a new top surface 141'. A roughness of the new top surface 141' of the under-test conductive trace 2 may be greater than that of the top surface 131 of the intact conductive trace 13. The new top surface 141' may have a bumpy topography. The new top surface 141' may be rougher than the top surface 131 of the intact conductive trace 13. In other words, the top surface 131 of the intact conductive trace 13 may be flatter than the new top surface 141' of the ruptured under-test conductive trace 2.

Figure 10:
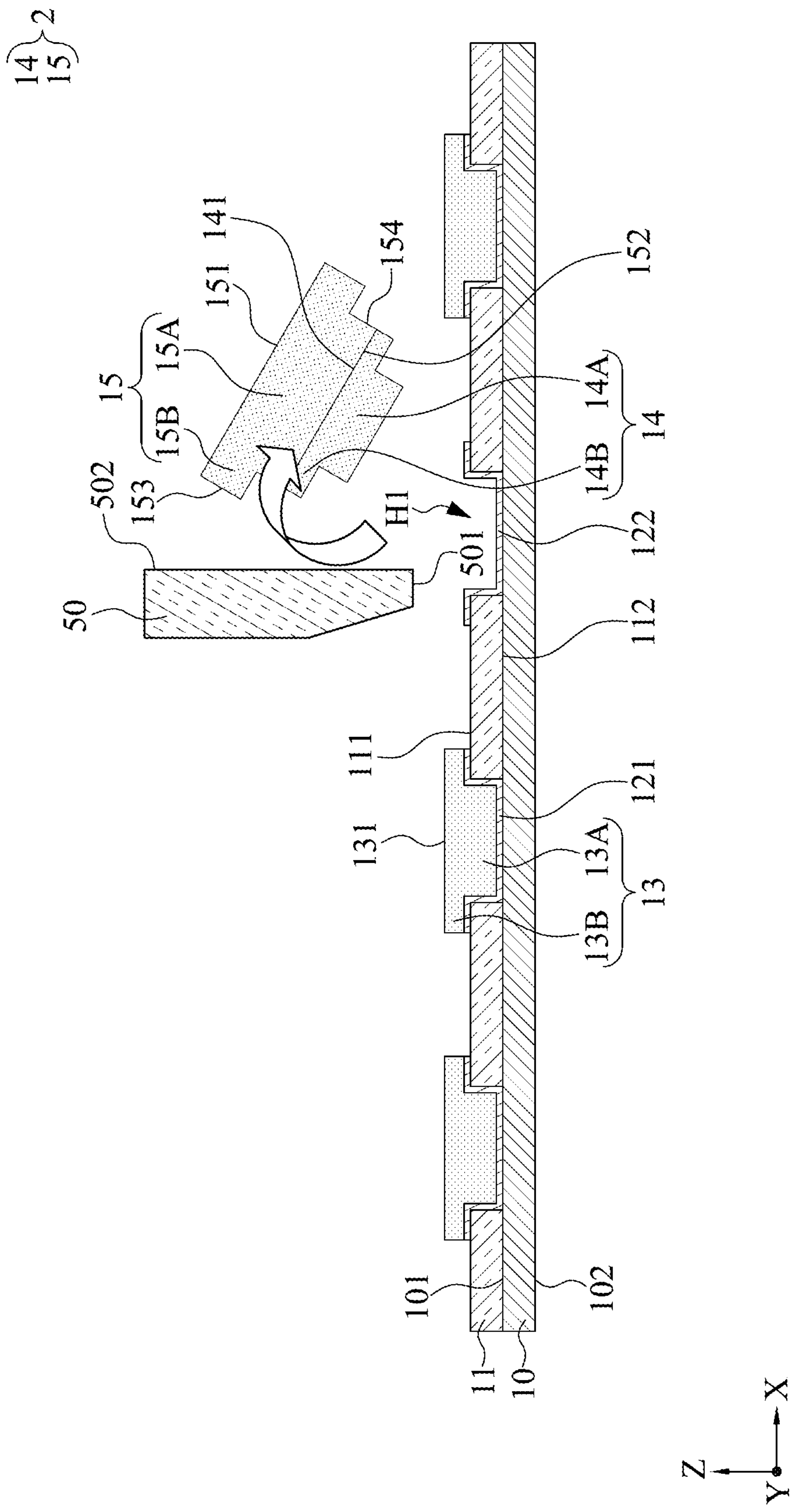
FIG. 10 illustrates one or more stages of an example of a testing method for a circuit pattern structure according to some embodiments of the present disclosure.

FIG. 10 illustrates one or more stages of an example of a testing method for a circuit pattern structure (e.g., the circuit pattern structure 100) according to some embodiments of the present disclosure. As shown in FIG. 10, the probe 50 may be moved to push the lateral surface 153 of the under-test conductive trace 2 to rupture at least a portion of the under-test conductive trace 2. In some embodiments, the conductive trace 2 may be separated from the seed layer 122. At least a portion of the seed layer 122 may be ruptured along with the under-test conductive trace 2. In some embodiments, a portion of the seed layer 122 may remain and a portion of the seed layer 122 may be removed. The seed layer 122 may partially cover a lateral surface of the dielectric layer 11.

Figure 10A:
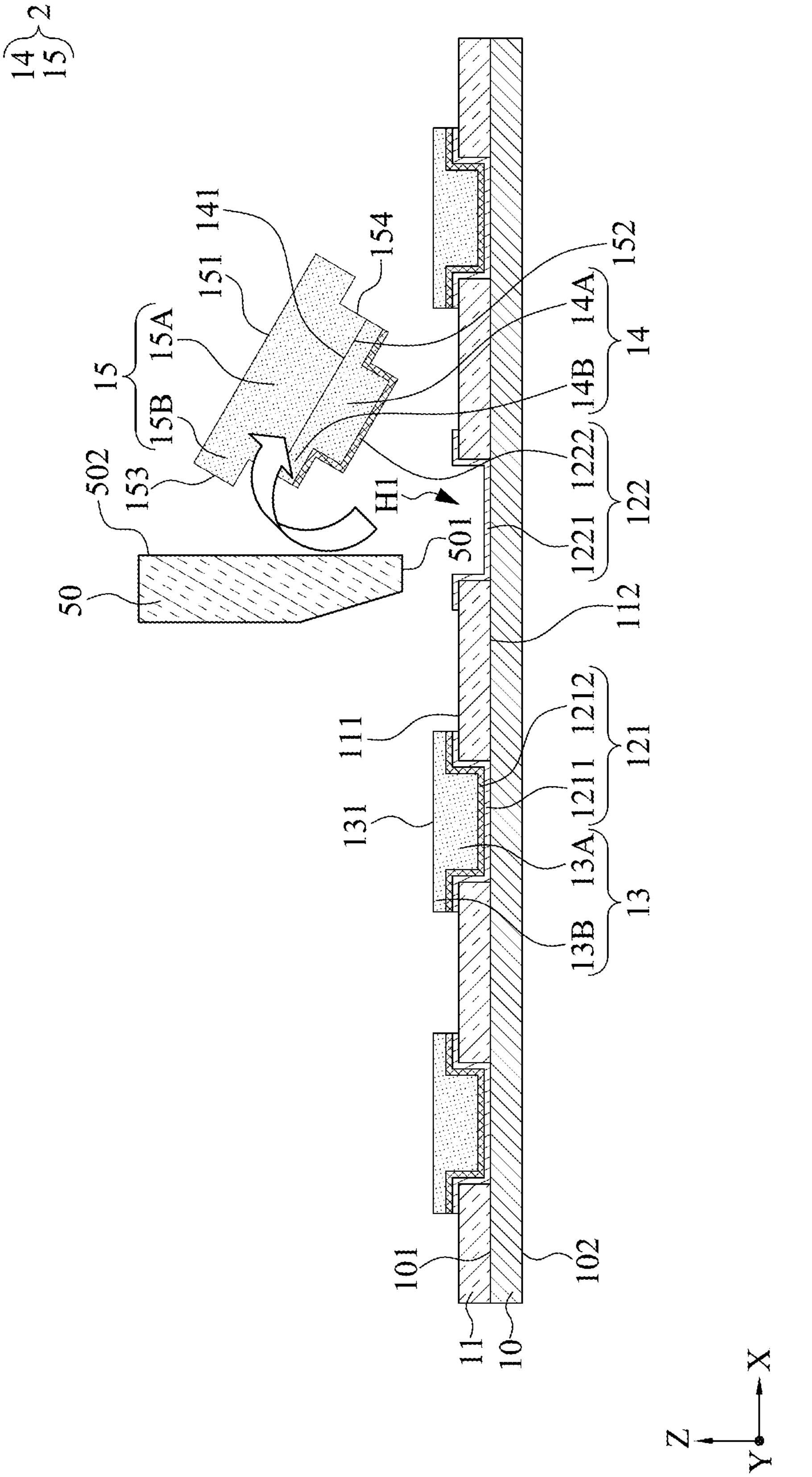
FIG. 10A illustrates one or more stages of an example of a testing method for a circuit pattern structure according to some embodiments of the present disclosure.

FIG. 10A illustrates one or more stages of an example of a testing method for a circuit pattern structure (e.g., the circuit pattern structure 100) according to some embodiments of the present disclosure. As shown in FIG. 10A, the probe 50 may be moved to push the lateral surface 153 of the under-test conductive trace 2 to rupture at least a portion of the under-test conductive trace 2. In some embodiments, the conductive trace 2 may be removed together with a portion 1222 of the seed layer 122. The portion 1222 may include copper (Cu). Meanwhile, a portion 1221 of the seed layer 122 may remain on the carrier 10 and the dielectric layer 11. The portion 1221 may include titanium (Ti). In some embodiments, the seed layer 121 may include a portion 1211 and a portion 1212. The portion 1212 may include copper (Cu). The portion 1211 may include titanium (Ti).

The bonding quality of the conductive trace 2 and the conductive trace 13 may be tested by pushing the under-test conductive trace 2 with the force (e.g., the force F1) by the probe 50. The probe 50 measures a reaction force which equals and is opposite to the applied force (e.g., the force F1). The adhesion quality between the under-test conductive trace 2 and the dielectric layer 11 may be determined by pushing the under-test conductive trace 2. Based on the value of the reaction force (or the shear stress) as detected by the probe 50, the adhesion quality between the conductive trace 2 and the dielectric layer 11 may be determined. As shown in FIGS. 7, 9 and 10, the seed layer 12 and the dielectric layer 11 may be ruptured together, or remain on the circuit pattern structure 100. That is the adhesive force between the seed layer 12 and the dielectric layer 11 may be greater than other interfaces (e.g., an interface between the seed layer 12 and the conductive trace 14). As such, the adhesion quality between the under-test conductive trace 2 and the dielectric layer 11 may be acceptable.

As shown in FIG. 8, the seed layer 12 is ruptured from the dielectric layer 11 during the previous discussed testing method. That is, the adhesive force between the seed layer 12 and the dielectric layer 11 may be smaller than the other interfaces. When the seed layer 12 is separated from the dielectric layer 11, the adhesive force value (or the measured force) between the seed layer 12 and the dielectric layer 11 may be checked whether is within a predetermined range by a detector electrically connected to the probe 50. A highest shear stress during a period that the probe 50 contacts the conductive trace 2 may be obtained and defined as the bonding quality of the circuit pattern structure 100 by a detector electrically connected to the probe 50. The adhesion quality between the under-test conductive trace 2 and the dielectric layer 11 may be checked or tested whether is acceptable based on the value of shear stress (or the highest shear stress) as detected by the probe 50. If the detected shear stress is greater than a predetermined value, the adhesion quality may be acceptable.

In some embodiments, based on the value of the shear stress, an adhesion quality between (i) the under-test conductive trace 2 and the dielectric layer 11 of the circuit pattern structure 100, (ii) the under-test conductive trace 2 and the seed layer 122 of the circuit pattern structure 100, or (iii) the dielectric layer 11 and the seed layer 122 of the circuit pattern structure 100 can be determined.

Figure 11:
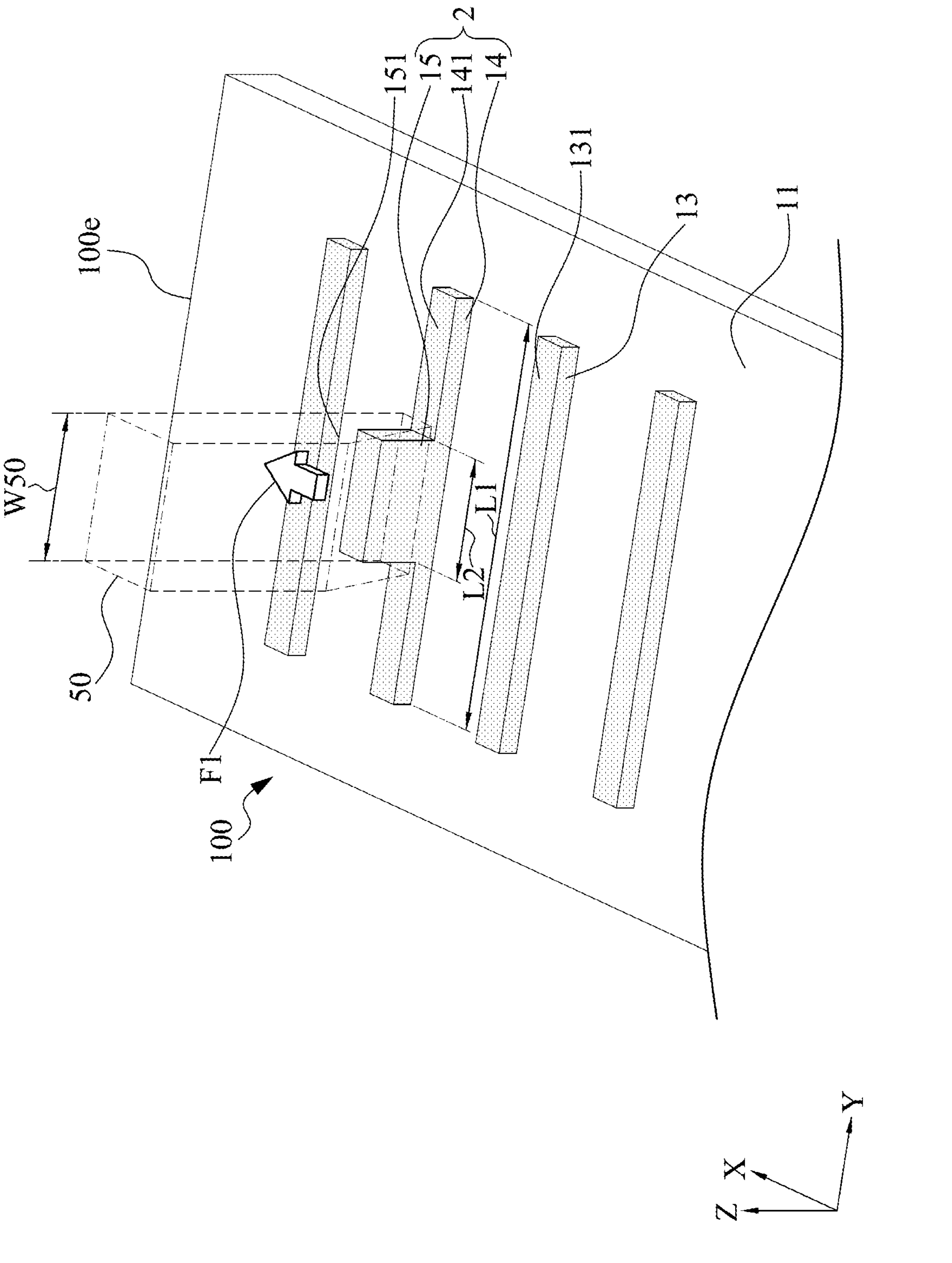
FIG. 11 illustrates one or more stages of an example of a testing method for a circuit pattern structure in 3D view according to some embodiments of the present disclosure.

FIG. 11 illustrates one or more stages of an example of a testing method for a circuit pattern structure in 3D view according to some embodiments of the present disclosure. As shown in FIG. 11, the width of the conductive trace 14 may be substantially the same as that of the conductive trace 2. The conductive trace 14 of the conductive trace 2 may have a long side having a length L1. The long side of the conductive trace 14 also refer to the symbol L1 for brevity. The protrusion portion 15 of the conductive trace 2 may have a long side having a length L2. The long side of the conductive trace 15 also refer to the symbol L2 for brevity. The length L2 of the protrusion portion 15 may be shorter than the length L1 of the conductive trace 14. The probe 50 may push the long side L2 of the protrusion portion 15 in the direction X. The probe 50 may have a width W50 substantially the same as the length L2 of the protrusion portion 15. In some embodiments, the probe 50 may be wider than the length L2 of the protrusion portion 15. The relatively large contact area between the probe 50 and the protrusion portion 15 may facilitate the pushing procedure of the testing method.

Figure 12:
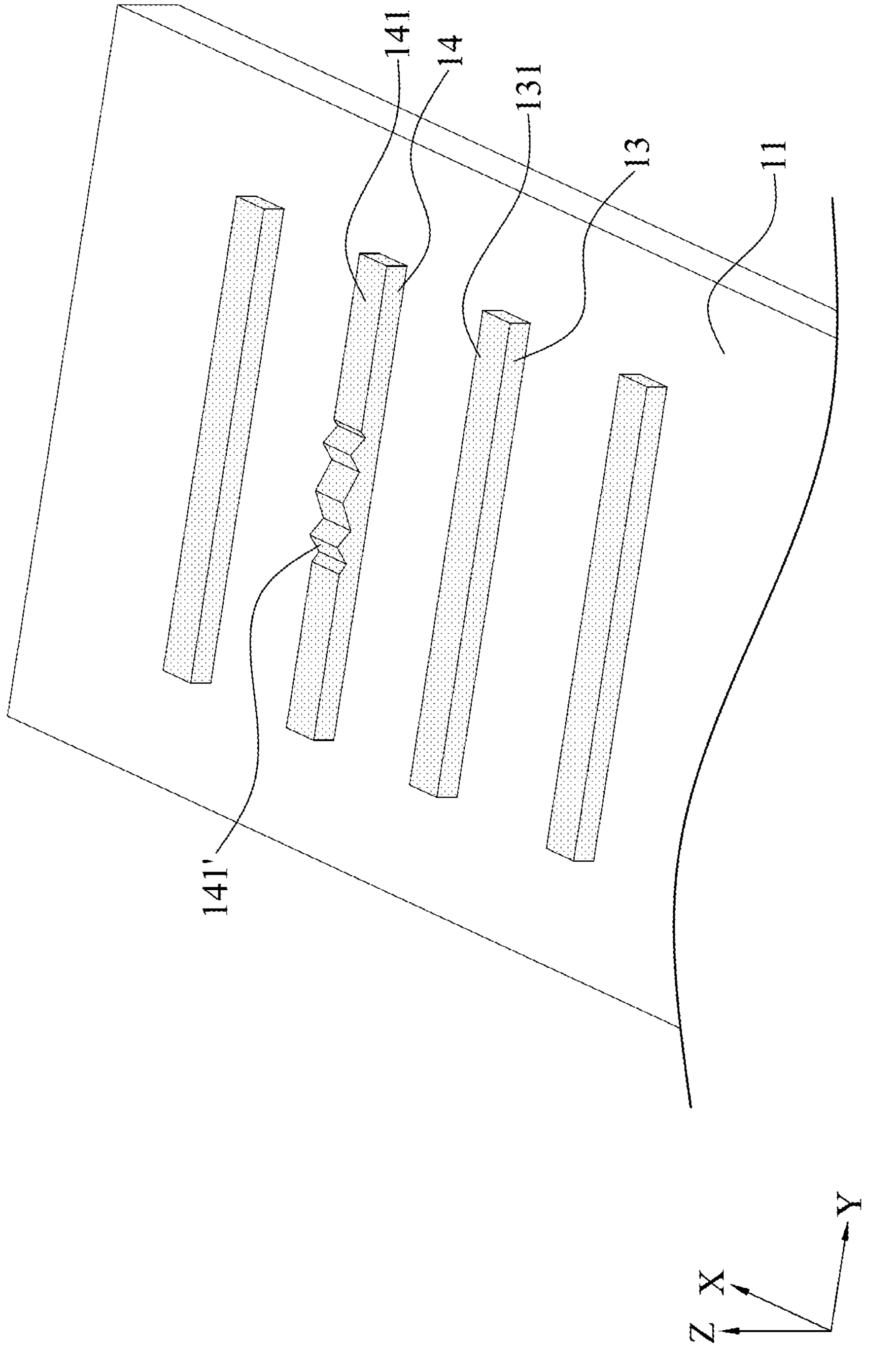
FIG. 12 illustrates one or more stages of an example of a testing method for a circuit pattern structure in 3D view according to some embodiments of the present disclosure.

FIG. 12 illustrates one or more stages of an example of a testing method for a circuit pattern structure (e.g., the circuit pattern structure 100) in 3D view according to some embodiments of the present disclosure. As shown in FIG. 12, the probe 50 may be moved to push the lateral surface 153 of the under-test conductive trace 2 to rupture at least a portion of the under-test conductive trace 2. After the under-test conductive trace 2 is ruptured, the under-test conductive trace 2 may have a new top surface 141'. A roughness of the new top surface 141' of the under-test conductive trace 2 may be greater than that of the top surface 131 of the intact conductive trace 13. The new top surface 141' may have a bumpy topography. The new top surface 141' may be rougher than the top surface 131 of the intact conductive trace 13. In other words, the top surface 131 of the intact conductive trace 13 may be flatter than the new top surface 141' of the ruptured under-test conductive trace 2.

In some comparative embodiments, the adhesion quality of an RDL is tested through an off-line method, such as transmission electron microscopy (TEM), scanning electron microscope (SEM), or the like. In some embodiments, a sample with an RDL may be rinsed with an etching solution before being investigated by SEM. The etching solution may induce one or more holes under the RDL, or in the dielectric layer under the RDL. The bigger the holes are, the lower the adhesion quality of the RDL. However, such an off-line method would damage the sample, and it takes an enormous amount of time to perform the off-line method and wait for the results thereof.

In some comparative embodiments, an adhesion quality test of an RDL is tested through a probe. The probe may apply a force to the RDL and detect a shear stress from the RDL. However, it is impractical to perform this test on the RDL with a fine pitch. The probe would touch a dielectric layer and conductive traces of the RDL when it moves over the RDL. The dielectric layer and the conductive traces of the RDL may experience unwanted damage and the value of the detected shear stress may include errors.

In the present disclosure, the protrusion portion 15 may be configured to increase the height of the conductive trace 2. The conductive trace 2 may be used for the test of the adhesion quality between the dielectric layer 11 and the conductive trace 2. The adhesion quality therebetween may represent the conductive traces (e.g., the conductive traces 13). The adhesion test as illustrated in FIGS. 2-12 includes applying the force F1 to the conductive trace 2 through the probe 50 and detecting a shear stress from the conductive trace 2 through the probe 50. The protrusion portion 15 facilitates the adhesion test for the conductive trace 2. Since the protrusion portion 15 has a greater height (e.g., the height H3) than other intact conductive traces (e.g., the conductive traces 13), the probe 50 may be positioned higher than the intact conductive traces in the adhesion test. In other words, the probe 50 in the adhesion test may be applied to the conductive trace 2 without touching the conductive traces (e.g., the conductive traces 13) and/or the dielectric layer 11. The height difference between the under-test conductive trace 2 and other conductive traces enables a probe to apply the force to the under-test conductive trace 2 without colliding with the other conductive traces. The higher elevation of the under-test conductive trace 2 provides more space between a probe and the dielectric layer 11 to prevent the collision between the probe and the dielectric layer 11.

Figure 13:
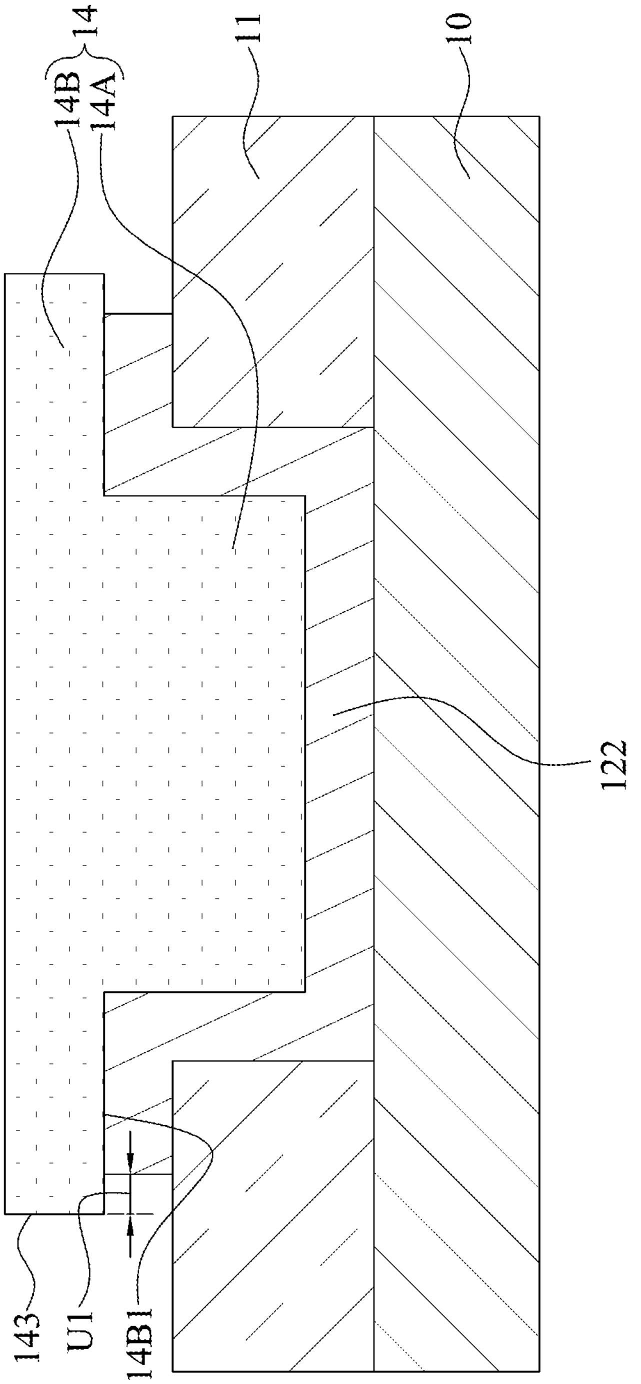
FIG. 13 illustrates a cross-sectional view of a portion of a circuit pattern structure according to some embodiments of the present disclosure.

FIG. 13 illustrates a cross-sectional view of a portion of a circuit pattern structure (e.g., the circuit pattern structure 100) according to some embodiments of the present disclosure. The circuit pattern structure 100 of FIG. 13 has an undercut U1 from an underside 14B1 of the portion 14B of the conductive trace 14. The undercut U1 may represent a space between an edge 143 of the portion 14B of the conductive trace 14 and the seed layer 122. The undercut U1 may be equal to or be less than 1.5 μm.

Figure 14:
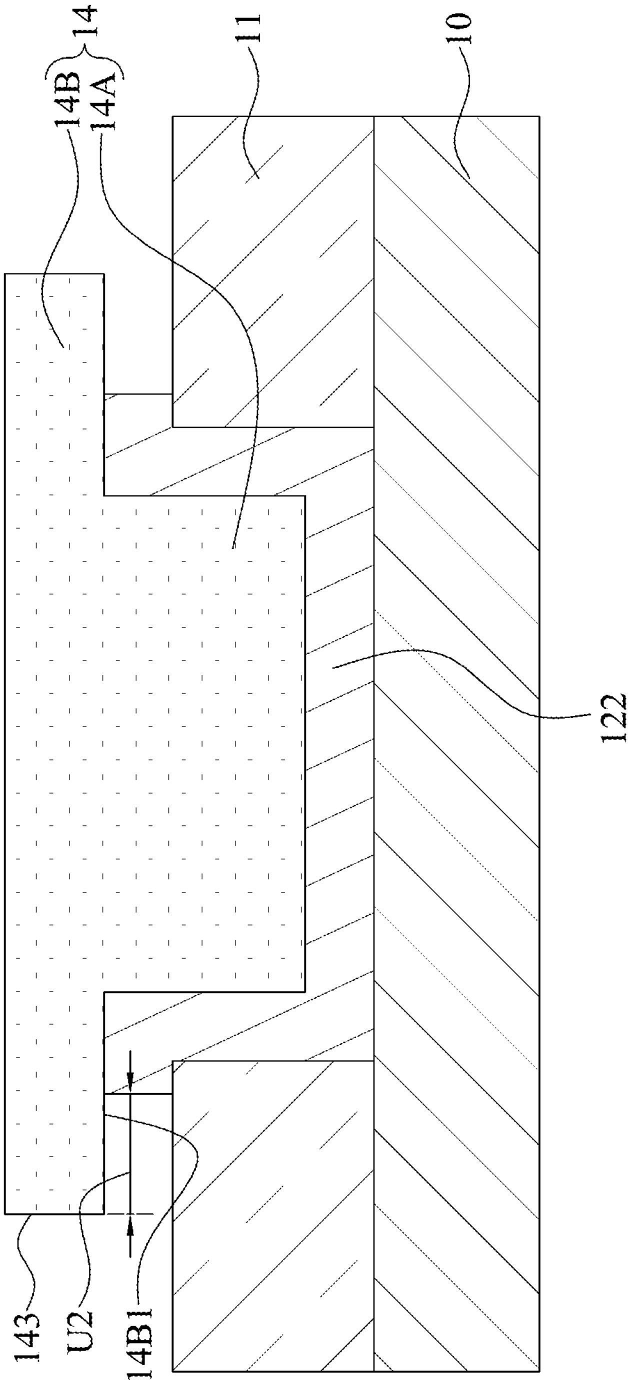
FIG. 14 illustrates a cross-sectional view of a portion of a circuit pattern structure according to some embodiments of the present disclosure.

FIG. 14 illustrates a cross-sectional view of a portion of a circuit pattern structure (e.g., the circuit pattern structure 100) according to some embodiments of the present disclosure. The circuit pattern structure 100 of FIG. 14 has an undercut U2 from the underside 14B1 of the portion 14B of the conductive trace 14. The undercut U2 may represent a space between the edge 143 of the portion 14B of the conductive trace 14 and the seed layer 122. The undercut U2 may be equal to or be less than 3 μm.

As shown in FIGS. 13 and 14, the circuit pattern structure of FIG. 14 shows a worse undercut condition (i.e., the undercut U2) than that of the circuit pattern structure of FIG. 13. The worse the undercut condition, the weaker the adhesion force will be between the seed layer 122 and the dielectric layer 11. Hence, during the adhesion test as illustrated in one or more of FIGS. 2-12, the conductive trace of FIG. 14 may be ruptured to have the conditions at least in FIGS. 7 and 8. In other words, during the adhesion test as illustrated in one or more of FIGS. 2-12, the conductive trace of FIG. 13 may be ruptured to have the conditions at least in FIGS. 9 and 10.

The adhesion test as illustrated in FIGS. 2-12 may acquire the value of the shear stress when the under-test conductive trace 2 is pushed by the probe 50. In some embodiments, the value of the shear stress that is acquired in the adhesion test on the conductive trace of FIG. 14 may be smaller than that of FIG. 13. In some embodiments, the value of the shear stress that is acquired in the adhesion test on the conductive trace of FIG. 13 may be 5-7 times that of FIG. 14. Depending on the value of the acquired shear stress, the adhesion quality of the conductive trace can be determined. The higher the value of the shear stress acquired, the better the adhesion quality of the conductive trace. FIGS. 7-10 illustrate the post-test conditions which represent different adhesion quality. For example, the post-test condition in FIG. 9 may represent a higher adhesion quality. A correlation may be built between the post-test conditions in FIGS. 7-10 and the values of the acquired shear stress. Different adhesion quality may correspond to different values of the acquired shear stress. Hence, the adhesion quality of the conductive traces may be determined based on the acquired shear stress.

Figure 15:
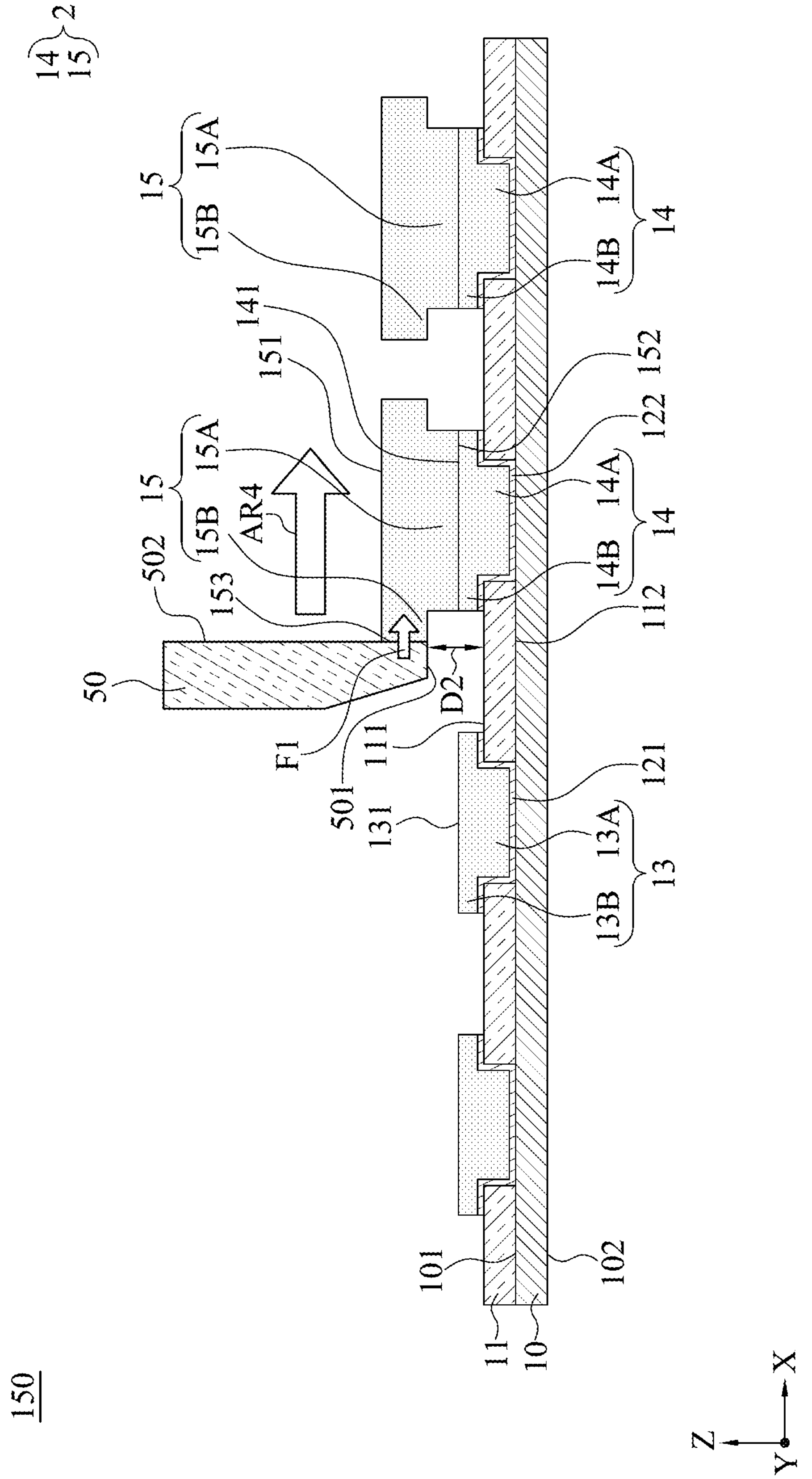
FIG. 15 illustrates one or more stages of an example of a testing method for a circuit pattern structure according to some embodiments of the present disclosure.

FIG. 15 illustrates one or more stages of an example of a testing method for a circuit pattern structure 150 according to some embodiments of the present disclosure. As shown in FIG. 15, the circuit pattern structure 150 may include a plurality of under-test conductive traces 2. One of the under-test conductive traces 2 may be adjacent to the edge of the circuit pattern structure 150. The probe 50 may have the movement AR4. In the movement AR4, the probe 50 may push a plurality of under-test conductive traces 2 in sequence. The probe 50 may apply the force to the lateral surface 153 of the protrusion portion 15 of one or more of the plurality of under-test conductive traces 2. The plurality of under-test conductive traces 2 may be ruptured to the same or different extents. For example, the plurality of under-test conductive traces 2 may have the condition of FIG. 7, 8, 9, 10, or 12.

Figure 16:
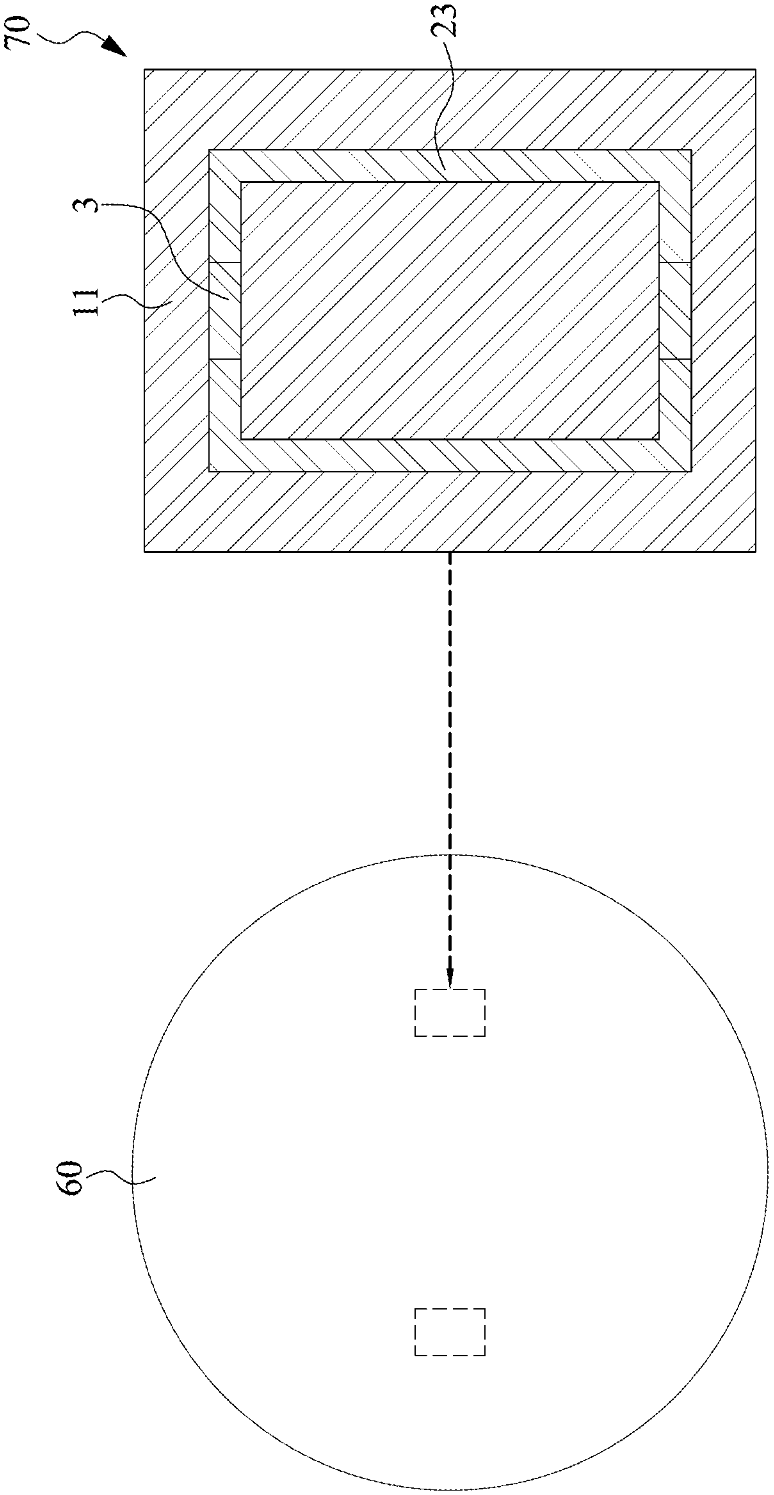
FIG. 16 illustrates a diagram of a carrier and an enlarged view of a circuit pattern structure of the carrier according to some embodiments of the present disclosure.

FIG. 16 illustrates a diagram of a carrier 60 and an enlarged view of a circuit pattern structure 70 of the carrier 60 according to some embodiments of the present disclosure. The carrier 60 may include the circuit pattern structure 70. The circuit pattern structure 70 may be similar to the circuit pattern structure 100. The circuit pattern structure 70 may include a conductive trace 3 and a conductive trace 23 in a dielectric layer 11. The conductive trace 3 may include a dummy pattern. The circuit pattern structure 70 may not include a semiconductor die. The conductive trace 3 and the conductive trace 23 may have no electrical function. The conductive trace 3 may include an alignment key. The conductive trace 3 and the conductive trace 23 in a dielectric layer 11 may be used for the alignment during the manufacture of the carrier 60. The conductive trace 3 and the conductive trace 23 may have a frame shape.

Figure 17:
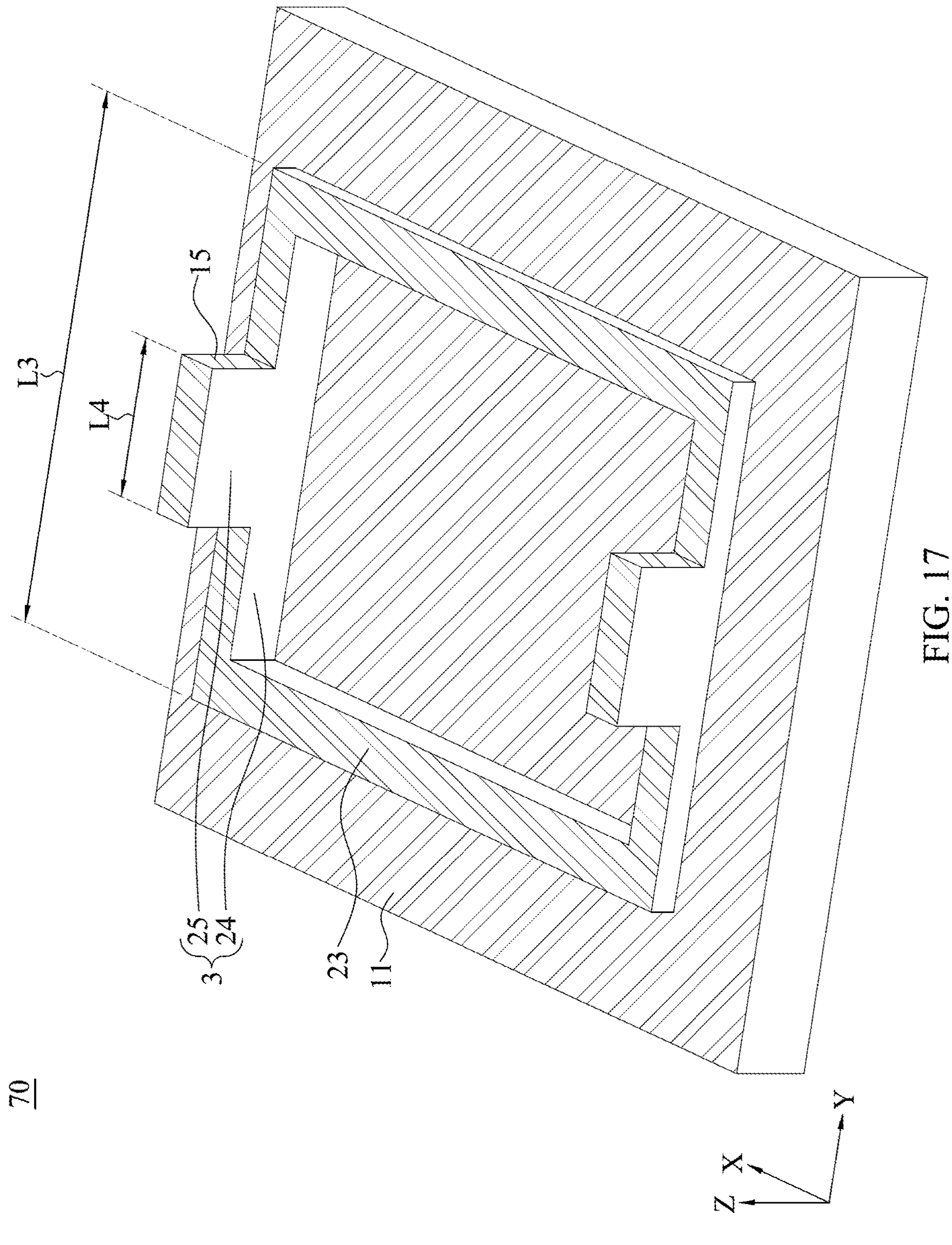
FIG. 17 illustrates a 3D view of a circuit pattern structure of FIG. 16.

FIG. 17 illustrates a 3D view of the circuit pattern structure (e.g., the circuit pattern structure 70) of FIG. 16. The conductive trace 3 may include a conductive trace 24 and a protrusion portion 25. The conductive trace 24 may be similar to the conductive trace 14 of FIGS. 1 and 11. The protrusion portion 25 may be similar to the protrusion portion 15 of FIGS. 1 and 11. The width of the conductive trace 24 may be substantially the same as that of the protrusion portion 25. The conductive trace 24 of the conductive trace 3 may have a length L3 and the protrusion portion 25 of the conductive trace 3 may have a length L4. The length L4 of the protrusion 25 may be shorter than the length L3 of the conductive trace 24. A probe (e.g., the probe 50) may push the protrusion portion 25 to rupture at least a portion of the conductive trace 3. The method as illustrated in FIGS. 2-12 can be applied to the circuit pattern structure 70. Since the circuit pattern structure 70 is irrelevant to the electrical function, the yield rate of the manufacture of the carrier 60 would not be impacted.

Figure 17A:
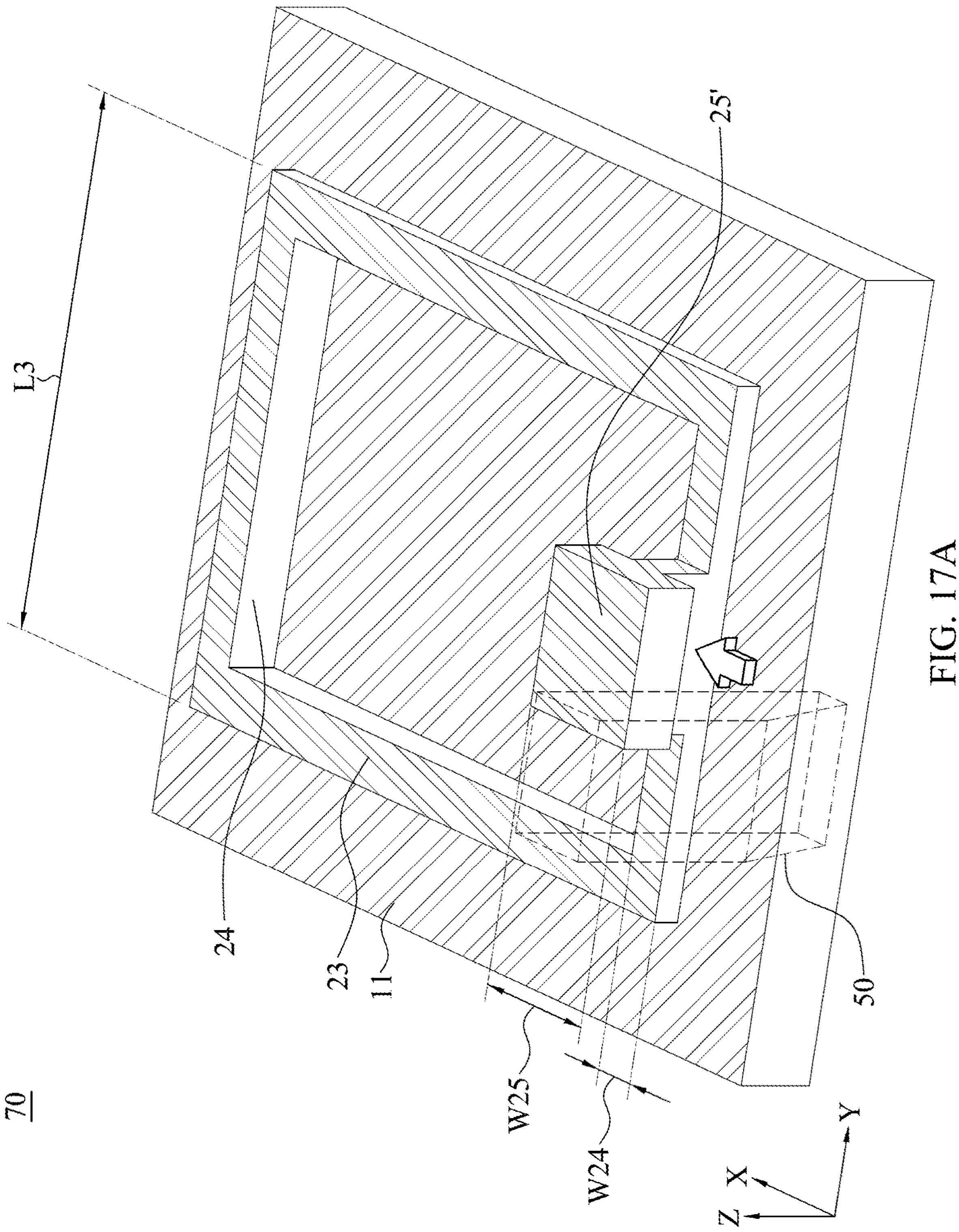
FIG. 17A illustrates a 3D view of a circuit pattern structure of FIG. 16.

FIG. 17A illustrates a 3D view of the circuit pattern structure (e.g., the circuit pattern structure 70) of FIG. 16. The circuit pattern structure of FIG. 17A may be similar to that of FIG. 17, the difference therebetween is that a protrusion portion 25' may have a width W25 greater than a width W24 of the conductive trace 24. The probe 50 may push the protrusion portion 25' in the X direction.

Figure 17B:
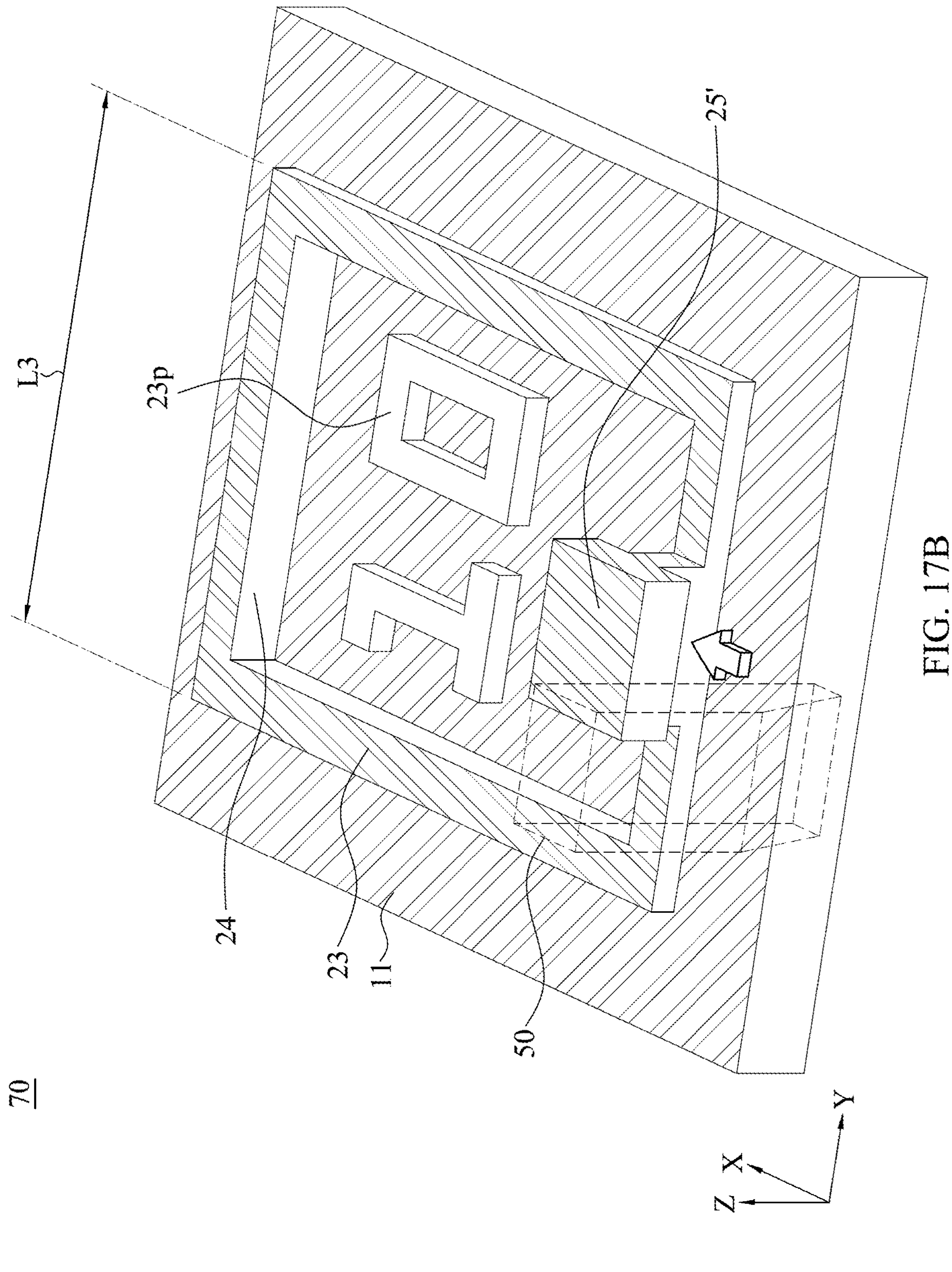
FIG. 17B illustrates a 3D view of a circuit pattern structure of FIG. 16.

FIG. 17B illustrates a 3D view of the circuit pattern structure (e.g., the circuit pattern structure 70) of FIG. 16. The circuit pattern structure of FIG. 17B may be similar to that of FIG. 17A, the difference therebetween is that circuit pattern structure of FIG. 17B may further comprise a pattern 23*p* surrounded by the conductive trace 24. The elevation of the probe 50 may be determined based on the pattern 23*p*. In some embodiments, the actuator of the probe 50 may be electrically connected to a controller which controls the actuator based on the detection signal associated with the pattern 23*p*. For example, the pattern 23*p* may represent a particular sign, e.g., the number 10. Once the controller receives the detection signal associated with the sign of number 10, the controller may control the actuator of the probe 50 to lower the elevation of the probe 50 with 10 μm or lower the elevation of the probe 50 such that the distance between the probe 50 and the dielectric layer 11 is 10 μm. In some embodiments, the pattern 23*p* may include any shapes as long as the controller can recognize it based on its library.

Figure 20:
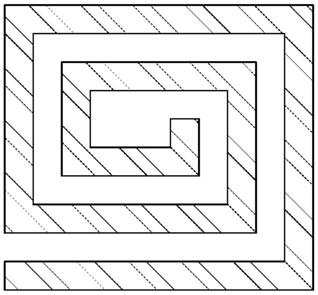
FIGS. 18, 19, and 20 each illustrate a top view of a circuit pattern structure according to some embodiments of the present disclosure.
Figure 19:
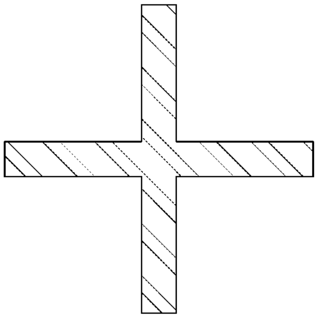
Figure 18:
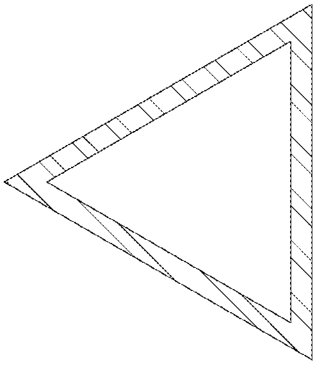

FIG. 18, 19, or 20 illustrate a top view of a conductive trace according to some embodiments of the present disclosure. The conductive trace may have a triangular shape, a cross shape, a meander shape. The conductive traces as shown in FIGS. 18, 19, and 20 may include a dummy pattern. The conductive traces as shown in FIGS. 18, 19, and 20 may include an alignment key.

FIG. 21 through FIG. 31 illustrate a method for manufacturing a circuit pattern structure according to some embodiments of the present disclosure. In some embodiments, the method is for manufacturing the circuit pattern structure 100 shown in FIGS. 1-12 and the circuit pattern structure 70 shown in FIGS. 16 and 17.

Figure 21:
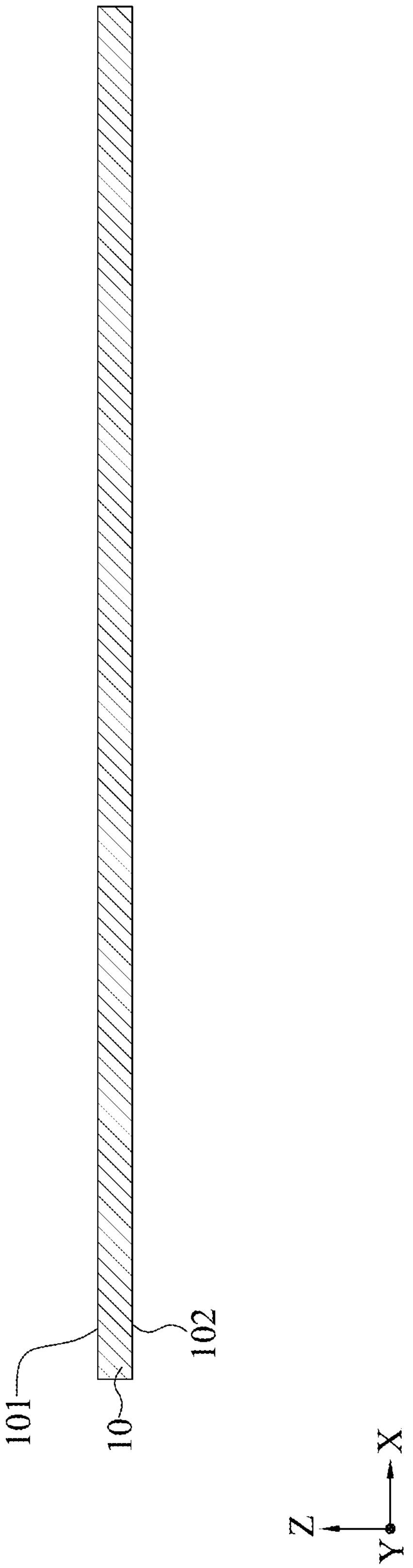
FIG. 21 illustrates one or more stages of an example of a method for manufacturing a circuit pattern structure according to some embodiments of the present disclosure.

As shown in FIG. 21, a carrier 10 may be provided. The carrier 10 may have a surface 101 and a surface 102 opposite to the surface 101. In some embodiments, the carrier 10 may include a lead frame encapsulated by molding compounds. In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate including silicon, germanium, or other suitable materials.

Figure 22:
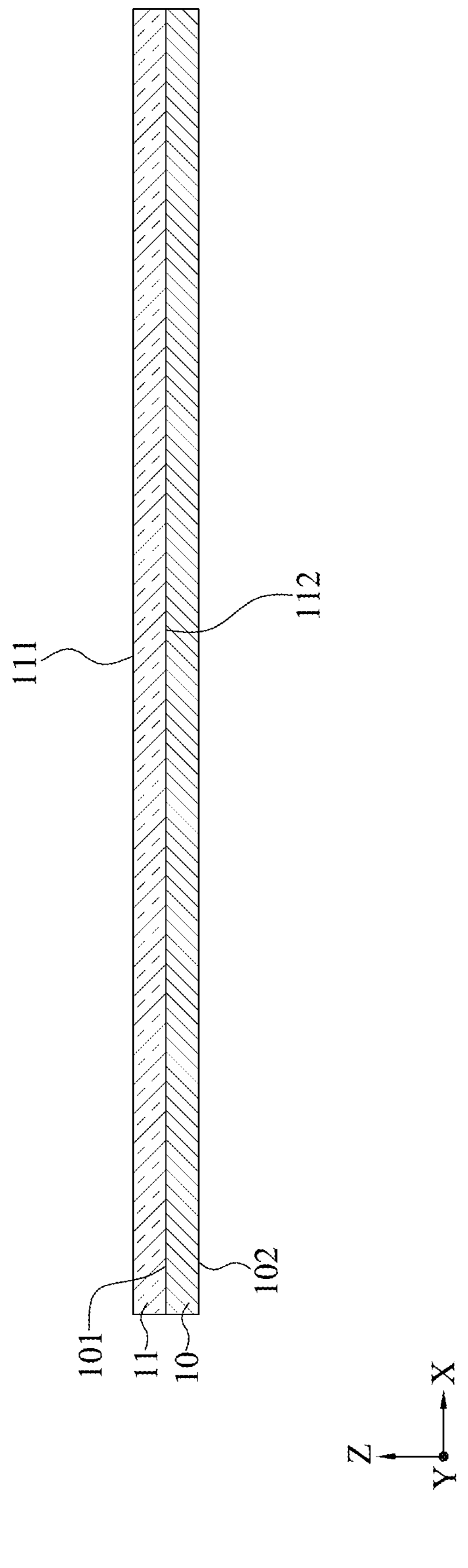
FIG. 22 illustrates one or more stages of an example of a method for manufacturing a circuit pattern structure according to some embodiments of the present disclosure.

As shown in FIG. 22, a dielectric layer 11 may be formed on the surface 101 of the carrier 10. The dielectric layer 11 may have a surface 111 facing away from the carrier 10 and a surface 112 opposite to the surface 111. The surface 112 of the dielectric layer 11 may be in contact with the surface 101 of the carrier 10. In some embodiments, a material of the dielectric layer 11 may be made of a cured photoimageable dielectric (PID) material such as epoxy or polyimide (PI) including photoinitiators. In addition, the dielectric layer 11 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

Figure 23:
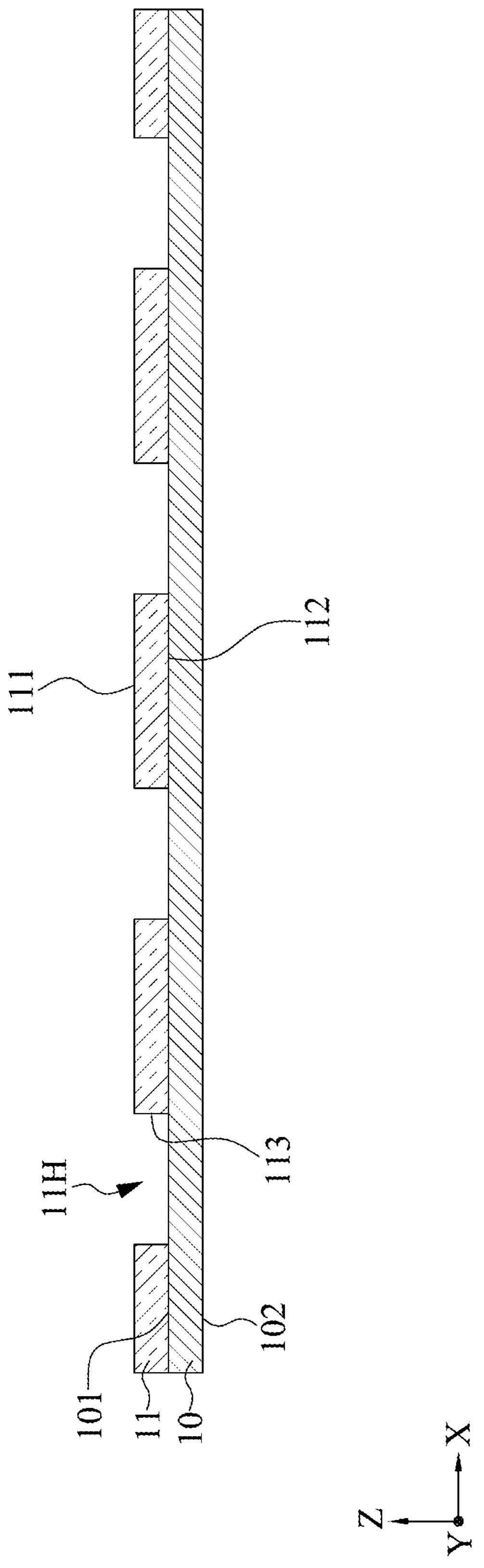
FIG. 23 illustrates one or more stages of an example of a method for manufacturing a circuit pattern structure according to some embodiments of the present disclosure.

As shown in FIG. 23, a plurality of holes (or trenches) 11H may be formed or defined in the dielectric layer 11 by, for example, an exposure and development process followed by an etching process. A portion of the surface 101 may be exposed from the holes (or trenches) 11H. The remaining dielectric layer 11 may have a plurality of lateral surfaces 113, which may also be referred to as sidewalls of the holes 11H.

Figure 23A:
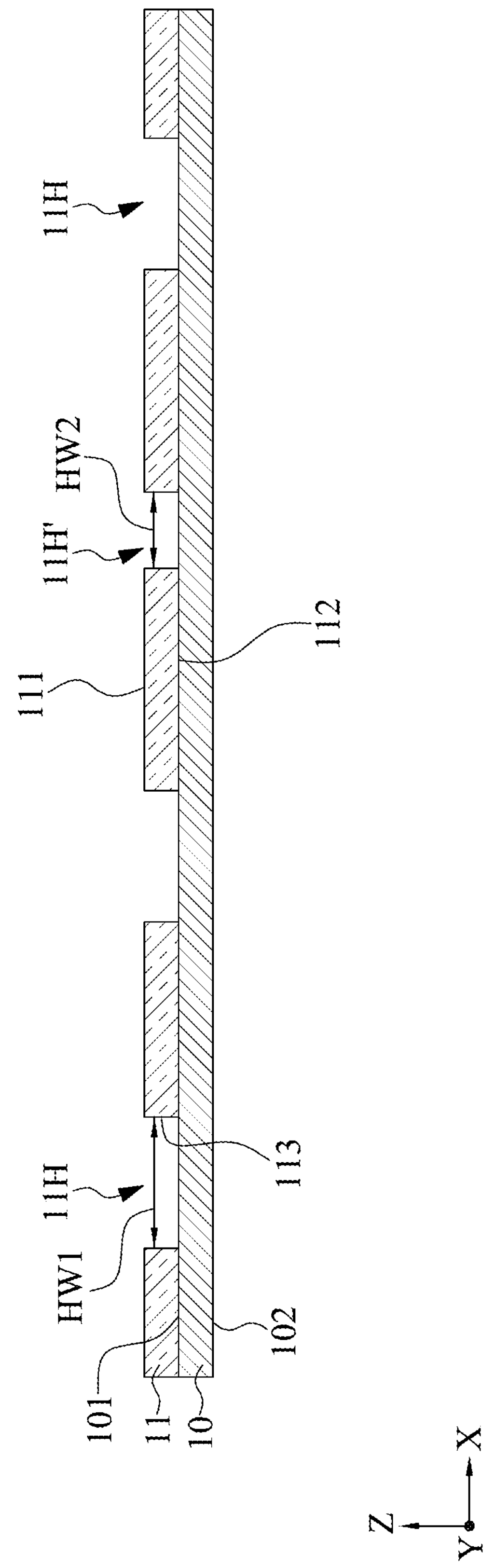
FIG. 23A illustrates one or more stages of an example of a method for manufacturing a circuit pattern structure according to some embodiments of the present disclosure.

FIG. 23A illustrates one or more stages of an example of a method for manufacturing a circuit pattern structure according to some embodiments of the present disclosure. The stages of FIG. 23A may be similar to those of FIG. 23, and the difference therebetween is that a hole (or trench) 11H' may be formed or defined in the dielectric layer 11 by, for example, an exposure and development process followed by an etching process. The hole 11H' may be surrounded by two holes 11H. The hole 11H may have a width HW1 and the hole 11H' may a width HW2 smaller than the width HW1. In some embodiments, the depth of the hole 11H and the depth of the hole 11H' may be substantially the same.

Figure 24:
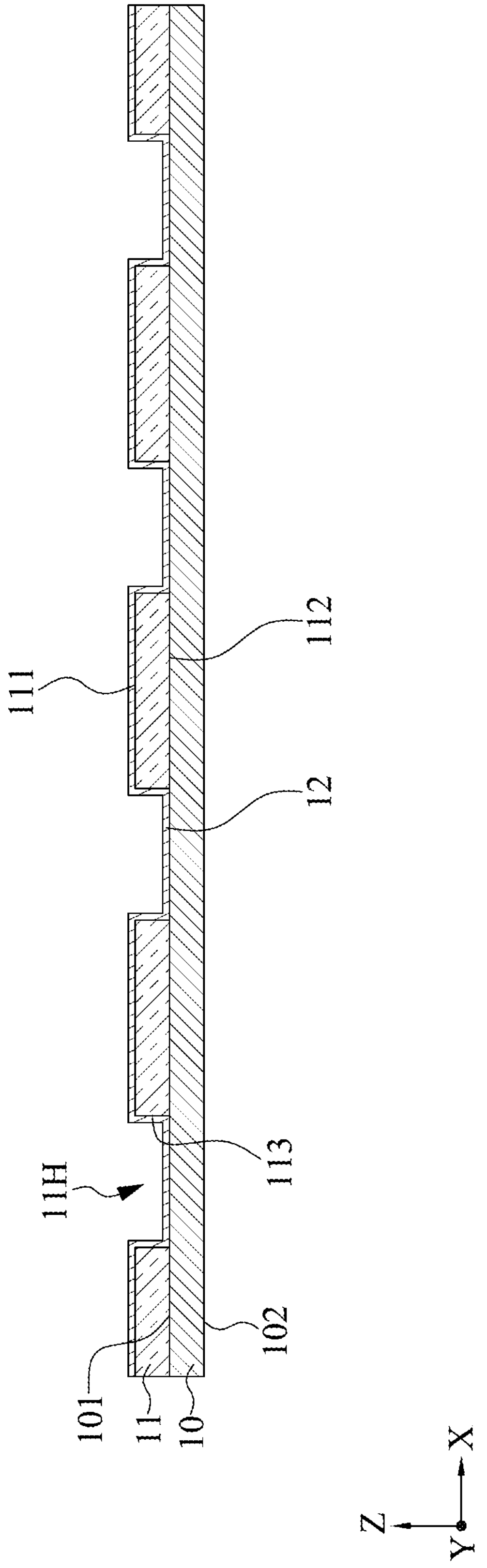
FIG. 24 illustrates one or more stages of an example of a method for manufacturing a circuit pattern structure according to some embodiments of the present disclosure.

As shown in FIG. 24, a seed material 12 may be formed along the exposed portion of the surface 101 of the carrier 10, the lateral surfaces 113 and the surface 111 of the dielectric layer 11 by, for example, a sputtering process. The seed material 12 may include copper (Cu), titanium (Ti), tin (Sn), stainless steel, another metal or metal alloy, or a combination thereof.

Figure 25:
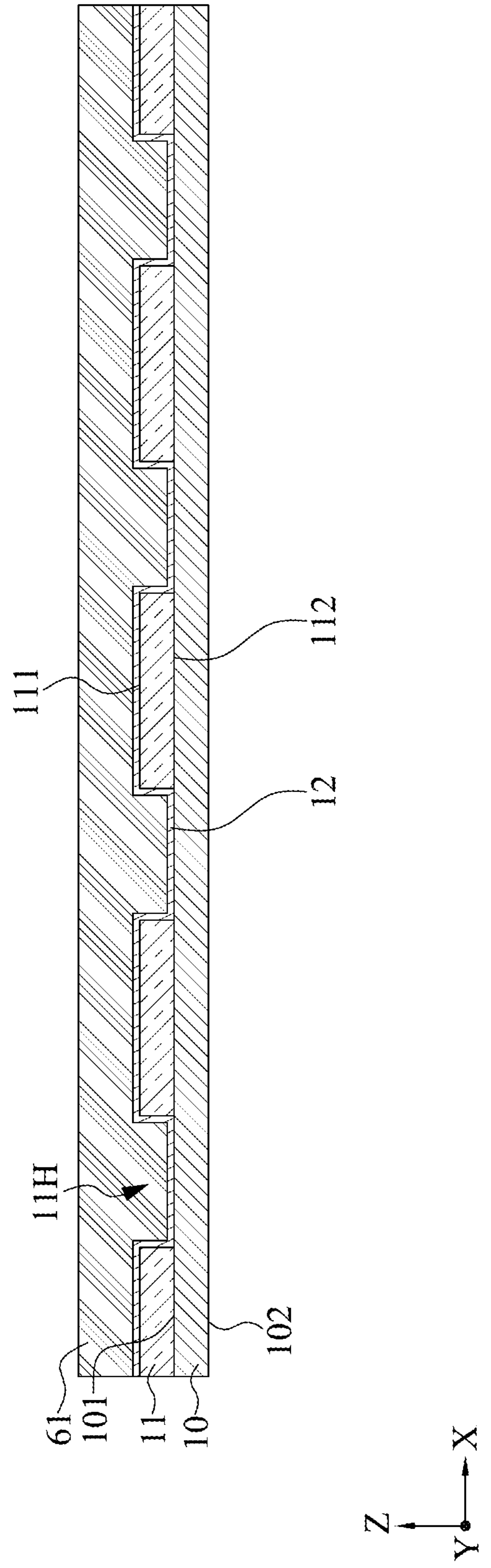
FIG. 25 illustrates one or more stages of an example of a method for manufacturing a circuit pattern structure according to some embodiments of the present disclosure.

As shown in FIG. 25, a photoresist 61 may be formed on the dielectric layer 11. The photoresist 61 may be formed on the holes 11H.

Figure 26:
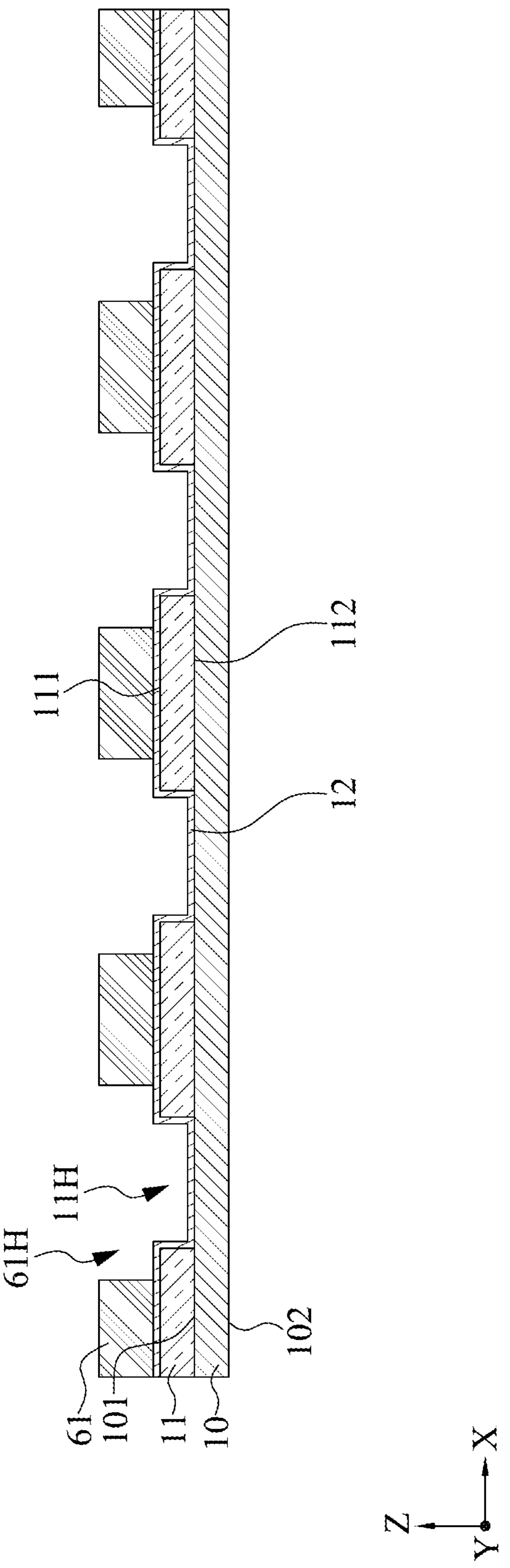
FIG. 26 illustrates one or more stages of an example of a method for manufacturing a circuit pattern structure according to some embodiments of the present disclosure.

As shown in FIG. 26, the photoresist 61 may be defined with a plurality of holes (or trenches) 61H through a mask by, for example, an exposure process and a development process. The holes 61H may be aligned with the holes 11H. The holes 61H may be wider than the holes 11H.

Figure 26A:
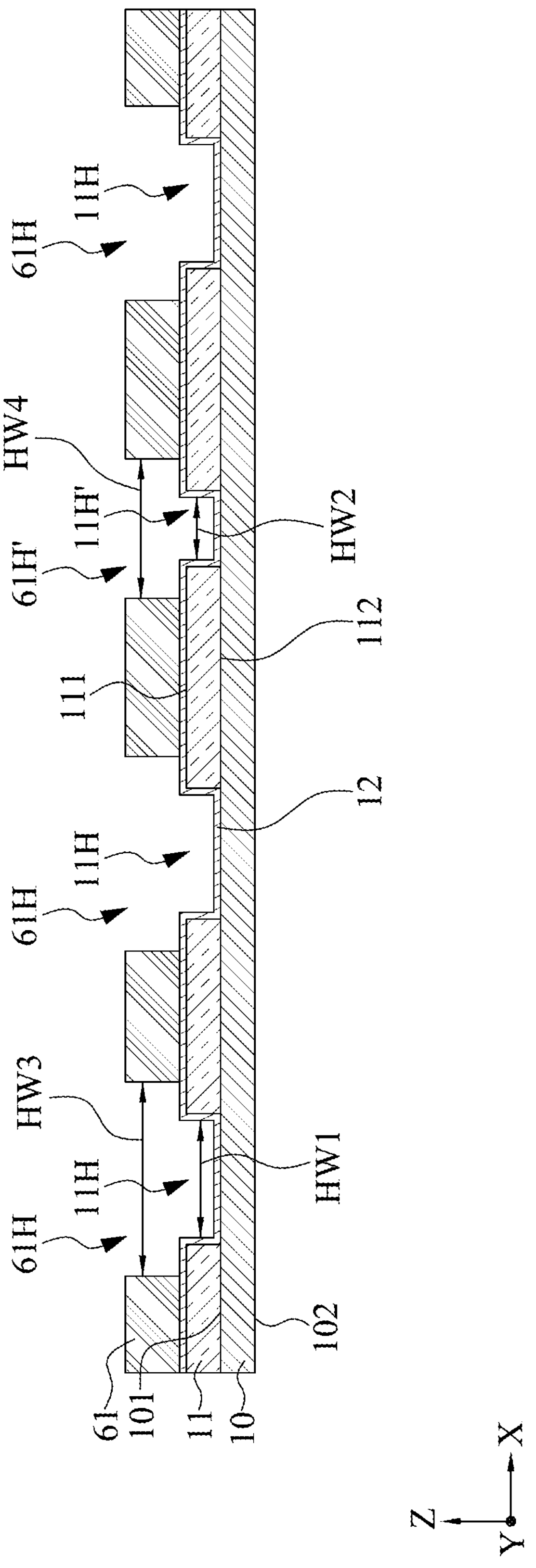
FIG. 26A illustrates one or more stages of an example of a method for manufacturing a circuit pattern structure according to some embodiments of the present disclosure.

FIG. 26A illustrates one or more stages of an example of a method for manufacturing a circuit pattern structure according to some embodiments of the present disclosure. The stages of FIG. 26A may be performed after the stages of FIG. 23A. The stages of FIG. 26A may be similar to those of FIG. 26, and the difference therebetween is that a hole (or trench) 61H' may be formed or defined in the photoresist 61 over the hole 11H'. The hole 61H' may be surrounded by two holes 61H. The hole 61H may have a width HW3 and the hole 61H' may a width HW4 smaller than the width HW3. In some embodiments, the depth of the hole 61H and the depth of the hole 61H' may be substantially the same. The width HW4 may be greater than the width HW2. The width HW3 may be greater than the width HW1.

Figure 27:
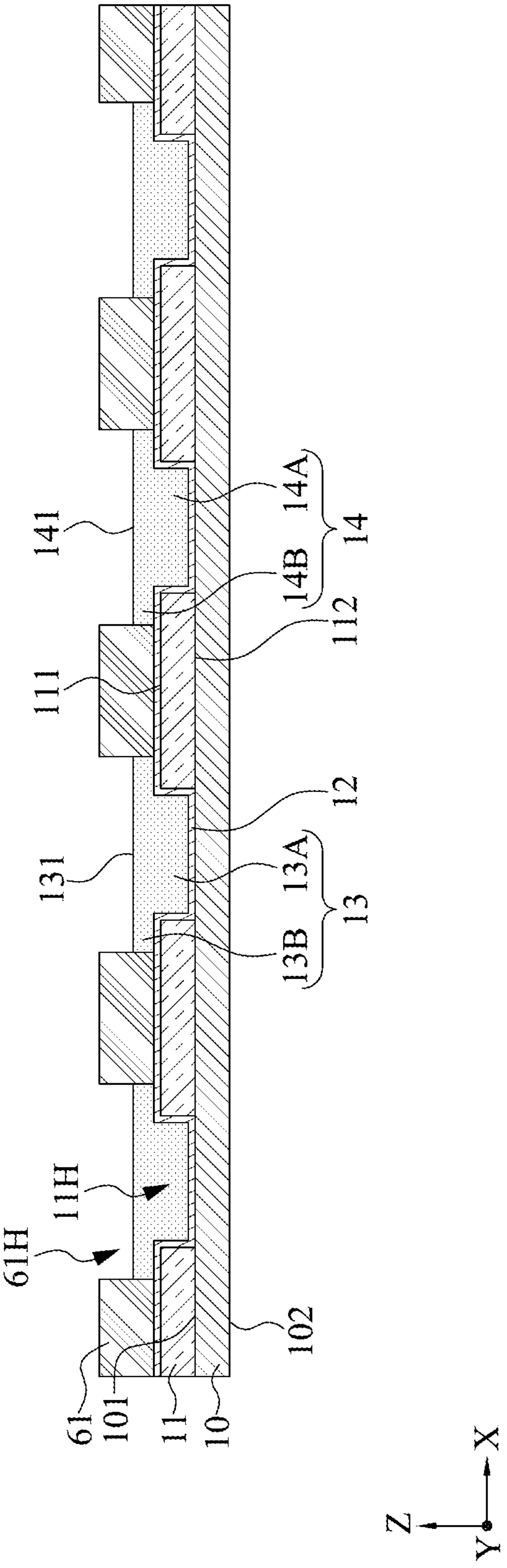
FIG. 27 illustrates one or more stages of an example of a method for manufacturing a circuit pattern structure according to some embodiments of the present disclosure.

As shown in FIG. 27, a conductive material may be formed in the holes 11H and the holes 61H by, for example, an electroplating process to form at least one conductive traces (at least one pads) 13 and a conductive trace (a pad) 14. The at least one conductive traces 13 may include two conductive traces. In some embodiments, the conductive traces 13 and the conductive trace 14 may be formed simultaneously. The conductive material may include copper (Cu), tin (Sn), aluminum (Al), gold (Au), silver (Ag), tungsten (W), nickel (Ni), or other suitable materials.

The conductive trace 13 may include a surface (a top surface) 131 facing away from the dielectric layer 11. In some embodiments, the surface 131 of the conductive trace 13 may be at an elevation higher than the surface 111 of the dielectric layer 11 relative to the carrier 10. The conductive trace 13 may have a "T" shape in a cross sectional view. The conductive trace 13 may include a portion 13A and a portion 13B disposed over the portion 13A. The portion 13A may be disposed in the holes 11H of the dielectric layer 11. The portion 13B may be disposed over the surface 111 of the dielectric layer 11. The conductive trace 14 may include a surface (a top surface) 141 facing away from the dielectric layer 11. In some embodiments, the surface 141 of the conductive trace 14 may be at an elevation higher than the surface 111 of the dielectric layer 11 relative to the carrier 10. The conductive trace 14 may have a "T" shape in a cross sectional view. The conductive trace 14 may include a portion 14A and a portion 14B disposed over the portion 14A. The portion 14A may be disposed in the holes 11H of the dielectric layer 11. The portion 14B may be disposed over the surface 111 of the dielectric layer 11.

Figure 27A:
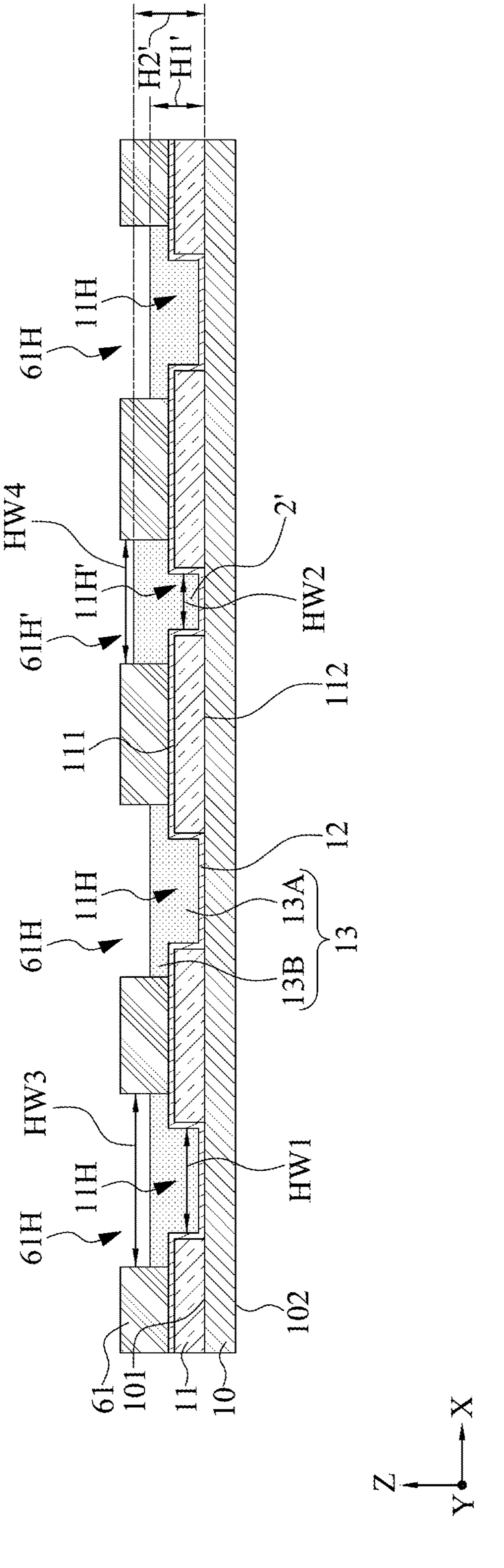
FIG. 27A illustrates one or more stages of an example of a method for manufacturing a circuit pattern structure according to some embodiments of the present disclosure.

FIG. 27A illustrates one or more stages of an example of a method for manufacturing a circuit pattern structure according to some embodiments of the present disclosure. The stages of FIG. 27A may be performed after the stages of FIG. 26A. The stages of FIG. 27A may be similar to those of FIG. 27, and the difference therebetween is will be discussed below.

As shown in FIG. 27A, at least one conductive traces 13 and a conductive trace 2' may be formed in a same step of a process (e.g., an electroplating process). The conductive trace 2' may be similar to the conductive trace 2 as illustrated in FIG. 27, except that the conductive trace 2' is formed in one piece. The width HW2 is smaller than the width HW1 and the width HW4 is smaller than the width HW3. The width of an opening defined by the hole 61H' and the hole 11H' is smaller than that of the hole 61H and the hole 11H. Since the same amount of the conductive material is deposited into these different-in-size openings, the conductive trace 2' may have a height H2' higher than a height H1 of the conductive trace 13.

Figure 28:
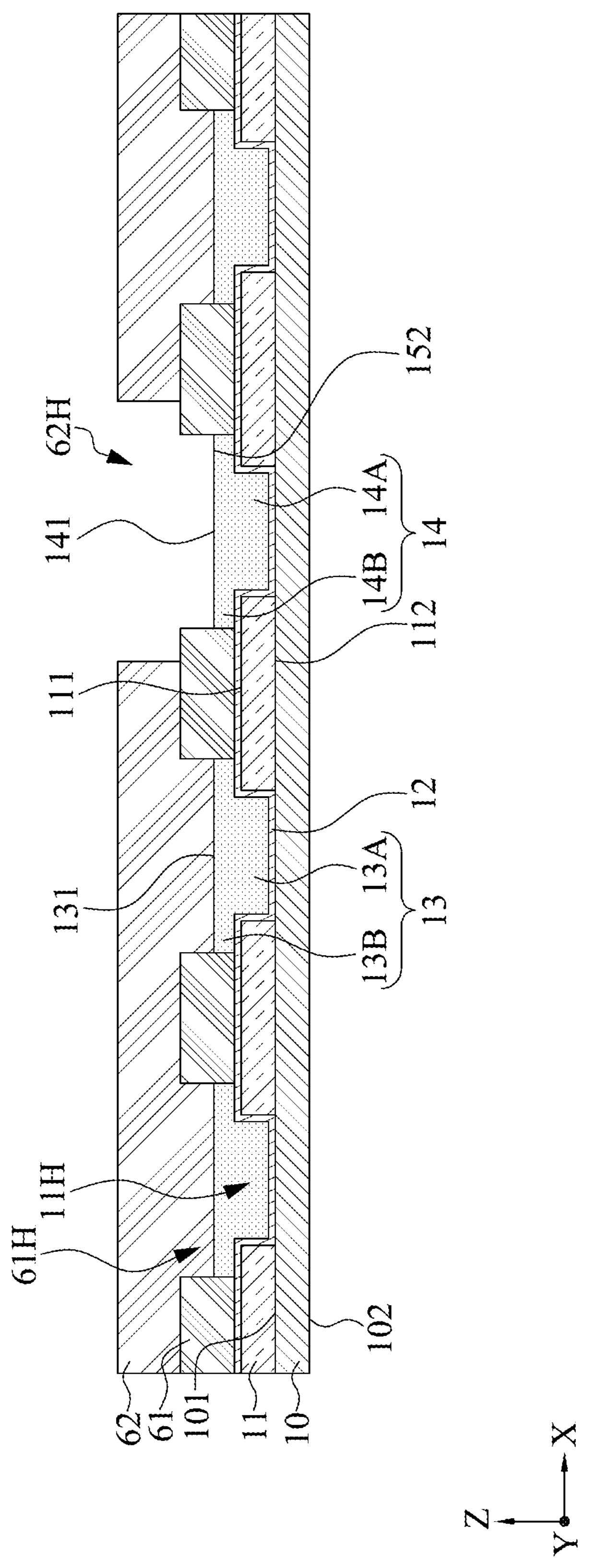
FIG. 28 illustrates one or more stages of an example of a method for manufacturing a circuit pattern structure according to some embodiments of the present disclosure.

As shown in FIG. 28, a photoresist 62 may be formed on the remaining photoresist 61 and the conductive trace 13 with a mask which covers the conductive trace 13. A hole (or a trench) 62H may be defined in the photoresist 62 over the conductive trace 14 and to expose the conductive trace 14 and a portion of the remaining photoresist 61 near the conductive trace 14. The photoresist 62 may be formed on the holes 61H.

Figure 29:
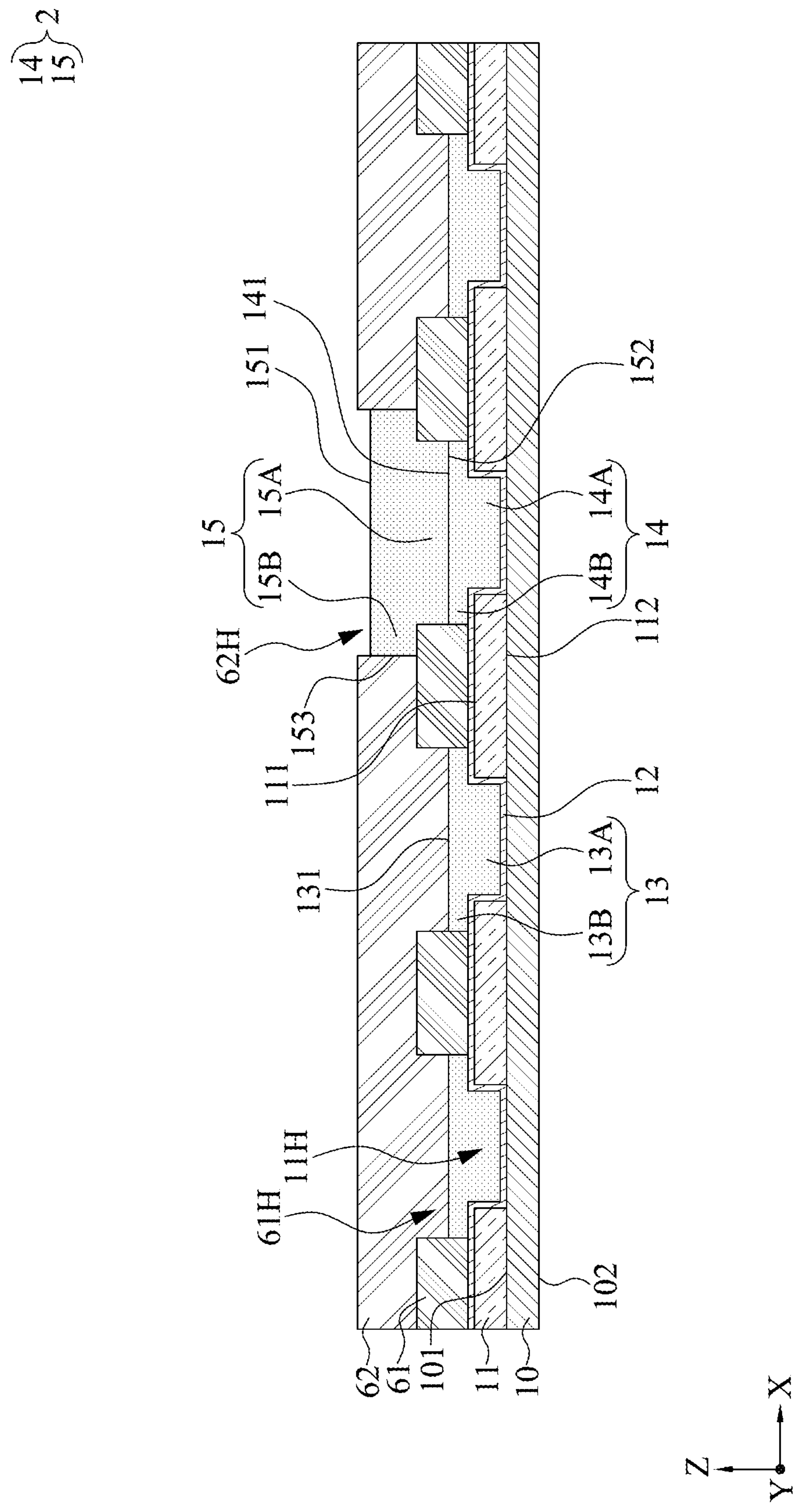
FIG. 29 illustrates one or more stages of an example of a method for manufacturing a circuit pattern structure according to some embodiments of the present disclosure.

As shown in FIG. 29, a conductive material may be formed in the holes 62H by, for example, an electroplating process to form a protrusion portion 15 over the conductive trace 14. The protrusion portion 15 and the conductive trace 14 may be referred to as a conductive trace 2. The conductive trace 2 may be formed between two conductive traces 13. The conductive material may include copper (Cu), tin (Sn), aluminum (Al), gold (Au), silver (Ag), tungsten (W), nickel (Ni), or other suitable materials.

The protrusion portion 15 may have a surface (or a top surface) 151 facing away from the surface 141 of the conductive trace 14 and a surface 152 opposite to the surface 151. The surface 152 of the protrusion portion 15 may be in contact with the surface 141 of the conductive trace 14. The protrusion portion 15 may have a "T" shape in a cross sectional view. The protrusion portion 15 may include a segment 15A and a segment 15B disposed over the segment 15A. The segment 15B may have a plurality of lateral surfaces 153 extending from the surface 151 of the protrusion portion 15. The surface 151 of the conductive trace 2 and the surface 131 of the conductive trace 13 may be at different elevations. In some embodiments, the protrusion portion 15 may have a thickness greater than that of the conductive trace 13.

Figure 30:
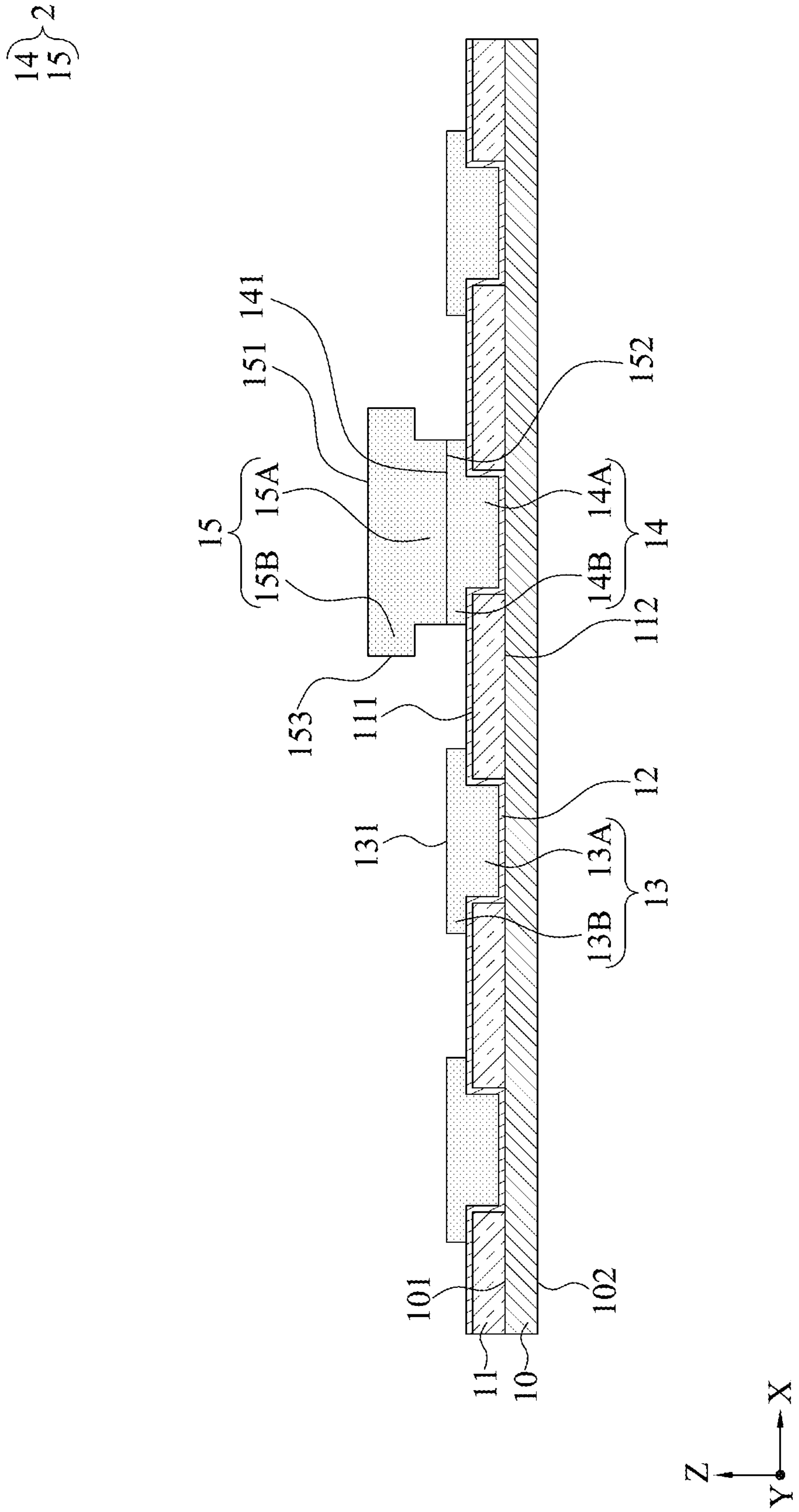
FIG. 30 illustrates one or more stages of an example of a method for manufacturing a circuit pattern structure according to some embodiments of the present disclosure.

As shown in FIG. 30, the remaining photoresist 61 and 62 may be removed by, for example, an etching process or strip process. A portion of the seed material 12 may be exposed by the conductive trace 13 and the conductive trace 2.

Figure 31:
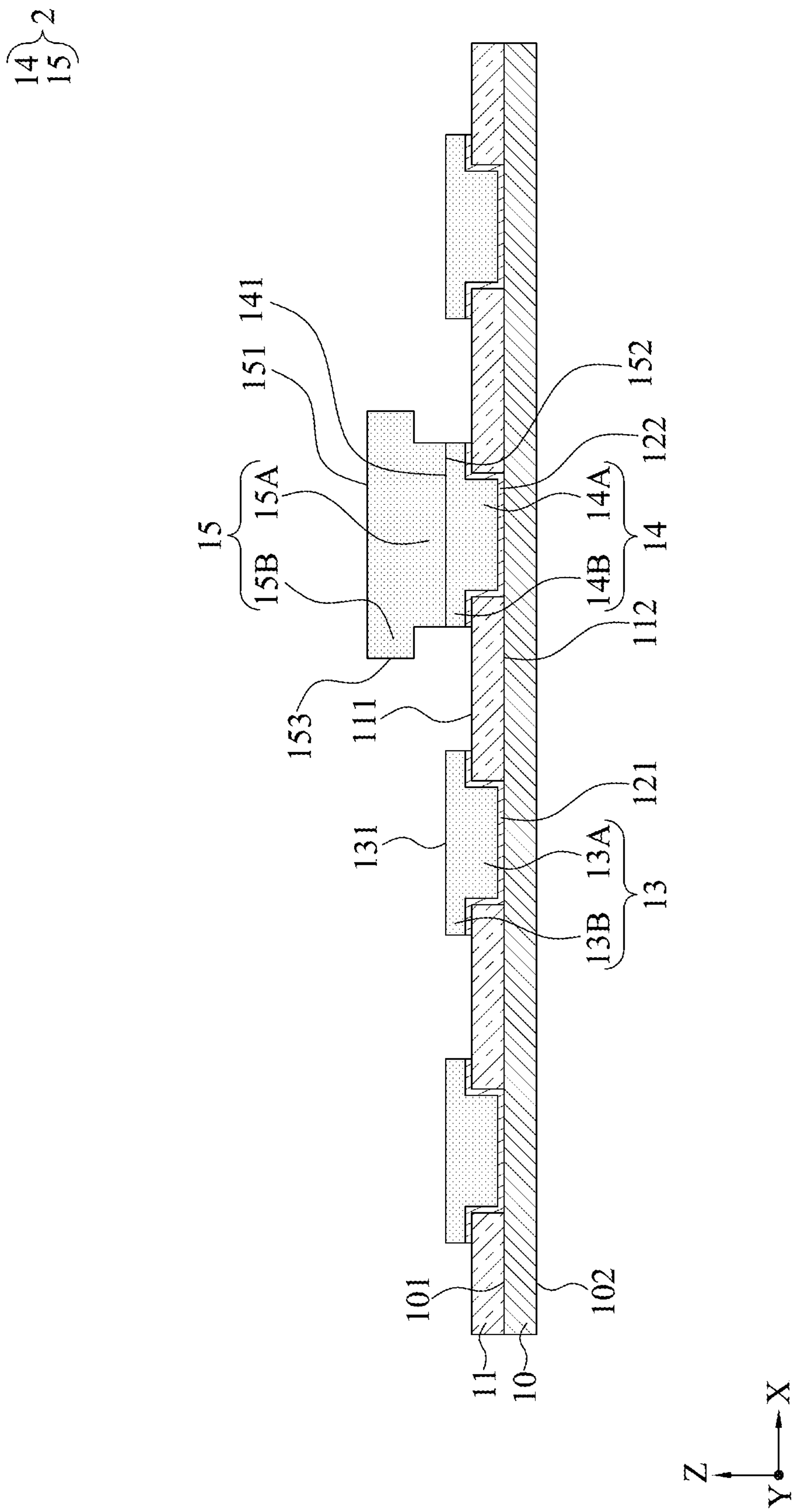
FIG. 31 illustrates one or more stages of an example of a method for manufacturing a circuit pattern structure according to some embodiments of the present disclosure.

As shown in FIG. 31, the exposed portion of the seed material 12 may be removed by, for example, an etching process to form a seed layer 121 below the conductive trace 13 and a seed layer 122 below the conductive trace 2 and a circuit pattern structure (e.g., the circuit pattern structure 100) may be formed. The etching process may induce an undercut as illustrated in FIGS. 13 and 14. As such, an edge of the seed layer 121 and a lateral surface of the portion 13B of the conductive trace 13 may not be coplanar, and an edge of the seed layer 122 and a lateral surface of the portion 14B of the conductive trace 14 may not be coplanar.

Figure 32:
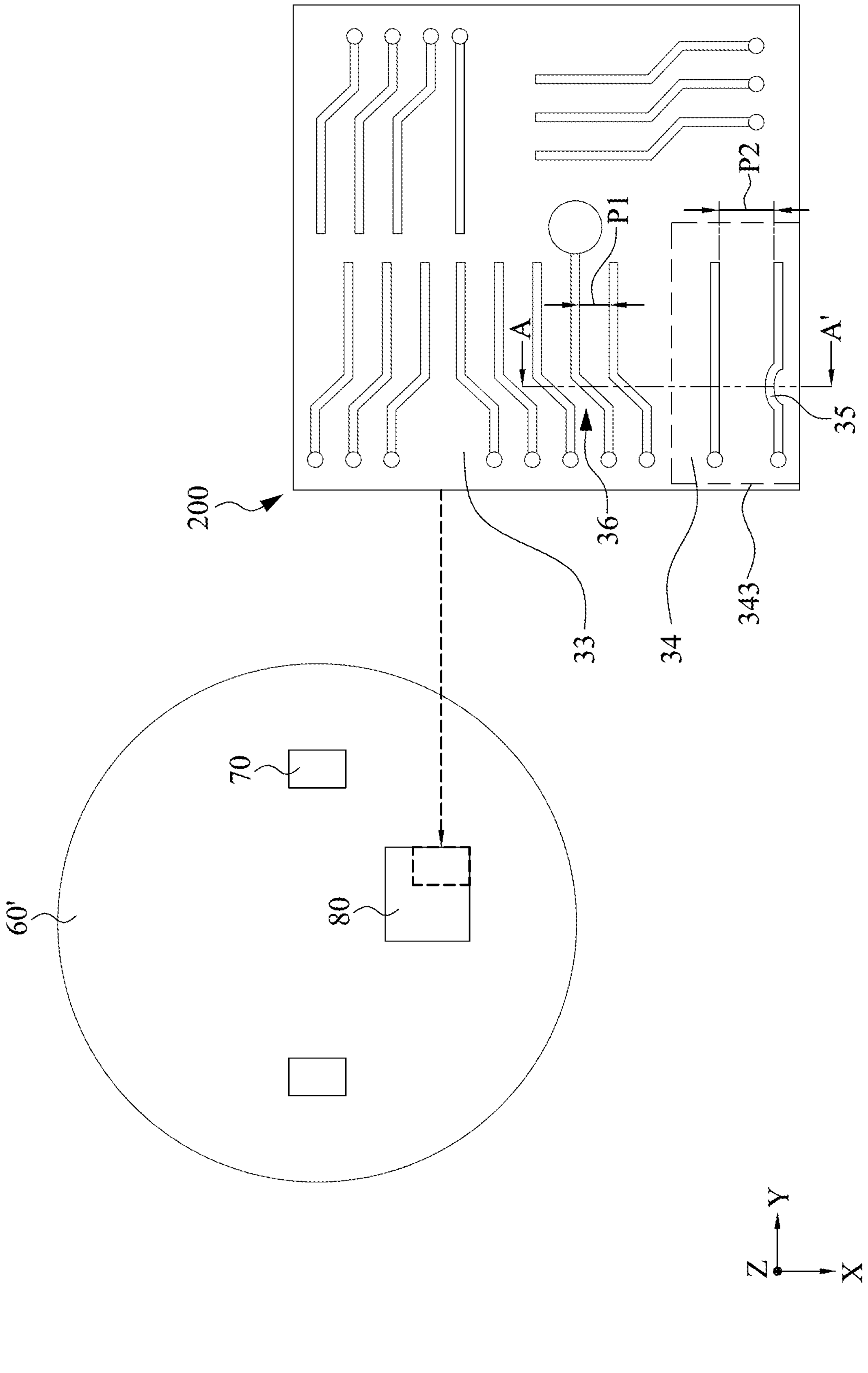
FIG. 32 illustrates a diagram of a carrier and an enlarged view of a circuit pattern structure of the carrier according to some embodiments of the present disclosure.

FIG. 32 illustrates a diagram of a carrier 60' and an enlarged view of a circuit pattern structure 200 of the carrier 60' according to some embodiments of the present disclosure. The carrier 60' may include an active region 80. The active region 80 may include a semiconductor die, an integrated circuit, or one or more processor, or the like. The carrier 60' may include a circuit pattern structure 70 and the circuit pattern structure 200. The circuit pattern structure 200 may be included in the active region 80. In some embodiments, the circuit pattern structure 200 may be outside of the active region 80. The circuit pattern structure 200 may be disposed adjacent to the active region 80. The detailed description of the circuit pattern structure 70 refers to the relevant paragraphs of FIGS. 16 and 17. In some alternative embodiments, the carrier 60' may exclude the circuit pattern structure 70.

As shown in the enlarged view of the circuit pattern structure 200 of FIG. 32, the circuit pattern structure 200 may include a dense region 33 and a sparse region 34. The dense region 33 may be disposed adjacent to the sparse region 34. The dense region 33 and the sparse region 34 may be referred to as an RDL. The dense region 33 may include a plurality of conductive traces (or intact conductive traces) 36. The conductive traces 36 may each include a plurality of portions extending in different directions in a top view.

The sparse region 34 may include under-test conductive traces 35. The sparse region 34 may have an edge 343. The under-test conductive traces 35 may be adjacent to the edge 343 of the sparse region 34. The under-test conductive traces 35 may be disposed outside of the dense region 33. The intact conductive traces 36 may have a pitch P1 and the under-test conductive traces 35 may have a pitch P2. The pitch P1 may be different from the pitch P2. The pitch P2 may be greater than the pitch P1. The pitch P1 between the pluralities of intact conductive traces 36 in the dense region 33 may be less than a distance between the under-test conductive trace 35 and the dense region 33.

Figure 33:
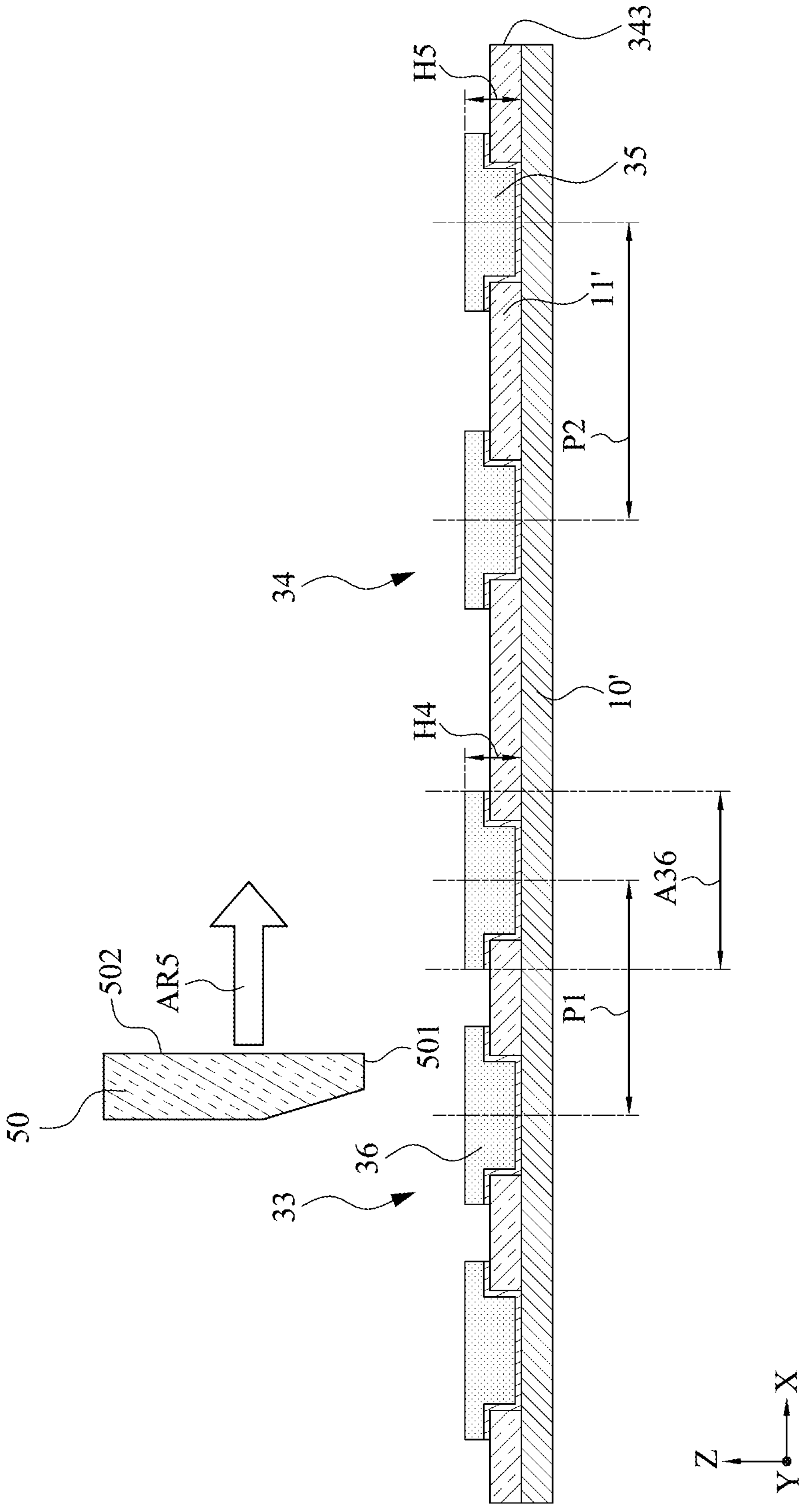
FIG. 33 illustrates one or more stages of an example of a testing method for a circuit pattern structure according to some embodiments of the present disclosure.

FIG. 33 illustrates one or more stages of an example of a testing method for a circuit pattern structure (e.g., the circuit pattern structure 200) according to some embodiments of the present disclosure. FIG. 33 illustrates a cross-sectional view along line A-A' in FIG. 32. The circuit pattern structure 200 may include a carrier 10' and a dielectric layer 11'. The carrier 10' may be similar to the carrier 10 of the circuit pattern structure 100 of FIG. 1. The dielectric layer 11' may be similar to the dielectric layer 11 of the circuit pattern structure 100 of FIG. 1. The conductive traces 36 may be similar to the conductive trace 13 of FIG. 1. The conductive traces 35 may be similar to the conductive trace 14 of FIG. 1. The conductive traces 36 may have a height H4 relative to the carrier 10'. The conductive traces 35 may have a height H5 relative to the carrier 10'. The height H4 and the height H5 may be substantially the same. A top surface of each of the intact conductive traces 36 may be substantially level with a top surface of the conductive trace 35 to be tested.

A probe 50 may be positioned through the method as illustrated in FIGS. 2-5. As shown in FIG. 33, the probe 50 may have a movement AR5 along direction X from the dense region 33 to the spare region 34. The conductive trace 36 may have a projecting area A36 on a surface of the circuit pattern structure 200. In the movement AR5 the probe 50 may be moved through the projecting area A36 of the conductive trace (e.g., the pad) 36.

Figure 34:
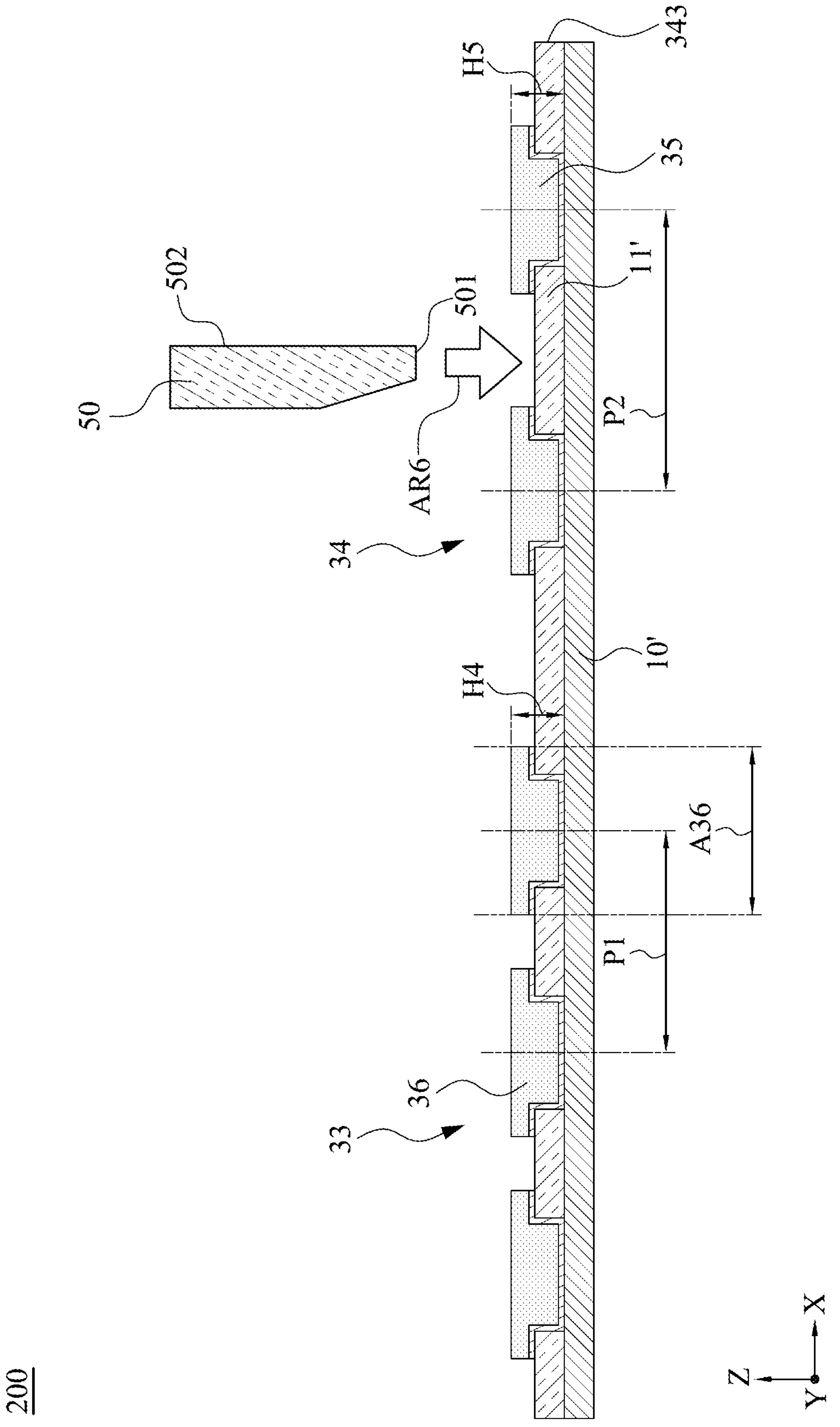
FIG. 34 illustrates one or more stages of an example of a testing method for a circuit pattern structure according to some embodiments of the present disclosure.

FIG. 34 illustrates one or more stages of an example of a testing method for a circuit pattern structure (e.g., the circuit pattern structure 200) according to some embodiments of the present disclosure. As shown in FIG. 34, the probe 50 may have a movement AR6 in a direction Z. The probe 50 may move toward the dielectric layer 11' in the movement AR6. The movement AR6 may be performed after the movement AR5.

Figure 35:
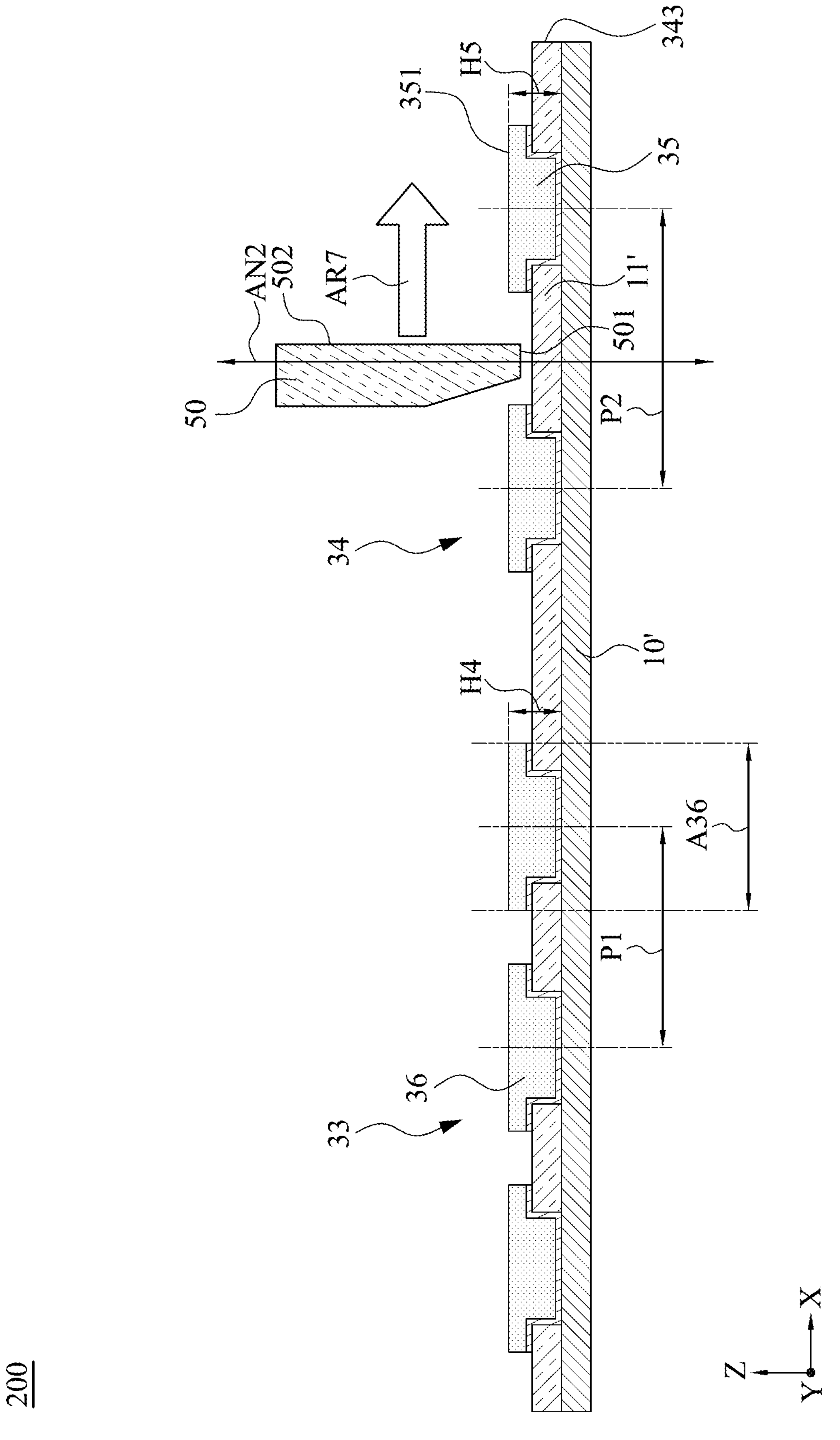
FIG. 35 illustrates one or more stages of an example of a testing method for a circuit pattern structure according to some embodiments of the present disclosure.

FIG. 35 illustrates one or more stages of an example of a testing method for a circuit pattern structure (e.g., the circuit pattern structure 200) according to some embodiments of the present disclosure. As shown in FIG. 35, after the movement AR6, the probe 50 may be moved to an elevation, such that the end 501 of the probe 50 is lower than a surface (or the upper surface) 351 of the conductive trace 35. The difference is that the probe 50 may be aligned with a portion of the dielectric layer 11' that is adjacent to the under-test conductive trace 35 in an axis AN2. The probe 50 may have a movement AR7. The probe 50 may move toward the under-test conductive trace 35 in the movement AR7.

Figure 36:
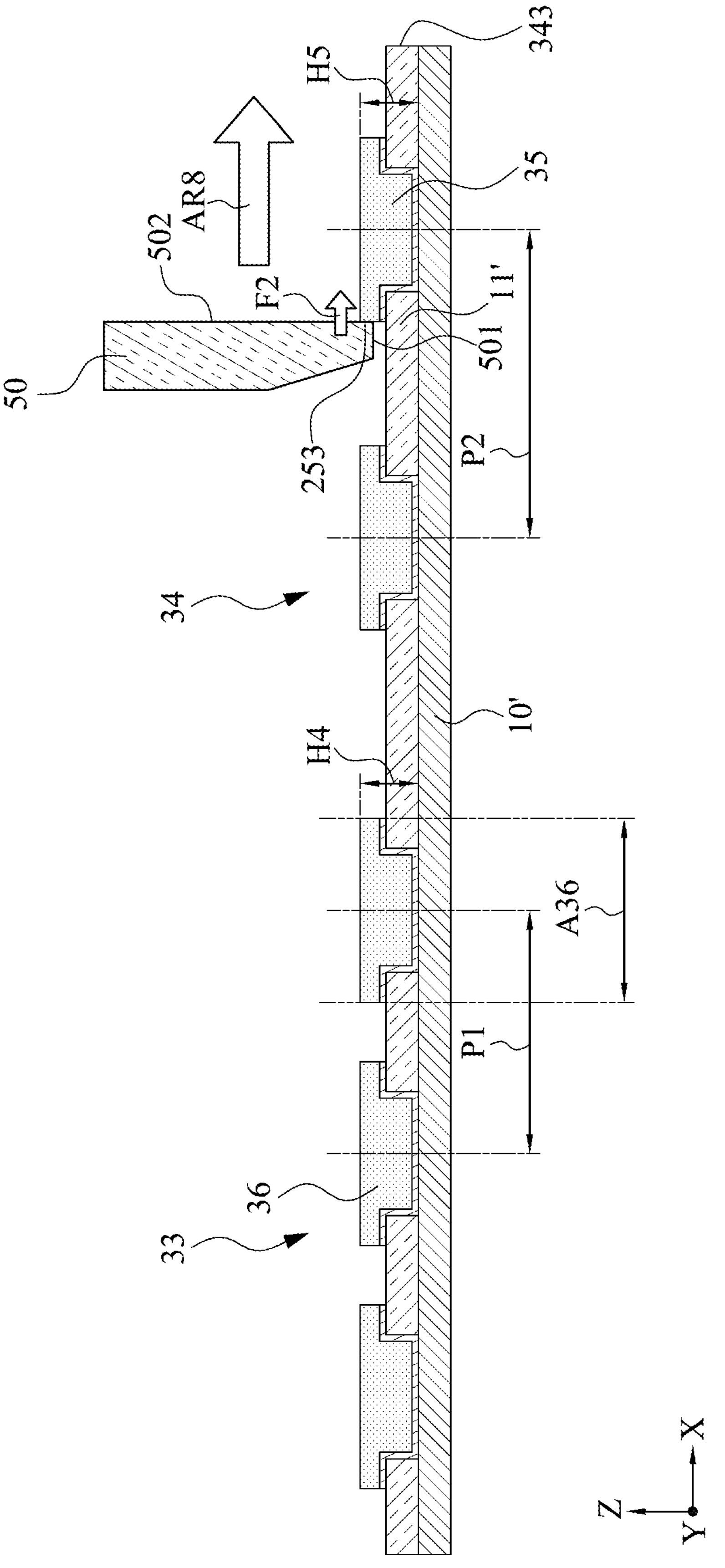
FIG. 36 illustrates one or more stages of an example of a testing method for a circuit pattern structure according to some embodiments of the present disclosure.

FIG. 36 illustrates one or more stages of an example of a testing method for a circuit pattern structure (e.g., the circuit pattern structure 200) according to some embodiments of the present disclosure. FIG. 36 illustrates a cross-sectional view along line A-A' in FIG. 32. As shown in FIG. 36, after the movement AR7, the probe 50 may push the conductive trace 35 to rupture at least a portion of the conductive trace 35 in a movement AR8. The probe 50 may apply a force F2 to the conductive trace 35. The conductive trace 35 may be ruptured to different extent, and a condition similar to one of those in FIGS. 7-10 may occur. The pitch P1 of the conductive traces 36 may not be sufficiently large for positioning the probe 50 without damaging the dielectric layer 11' or the conductive traces 36. In the present disclosure, the pitch P2 of the under-test conductive traces 35 may leave sufficient room for positioning the probe 50. Therefore, the probe 50 may be free from being in contact with dielectric layer 11', the conductive traces 36 and the under-test conductive traces 35 before applying the force F2 to the under-test conductive traces 35.

Figure 37:
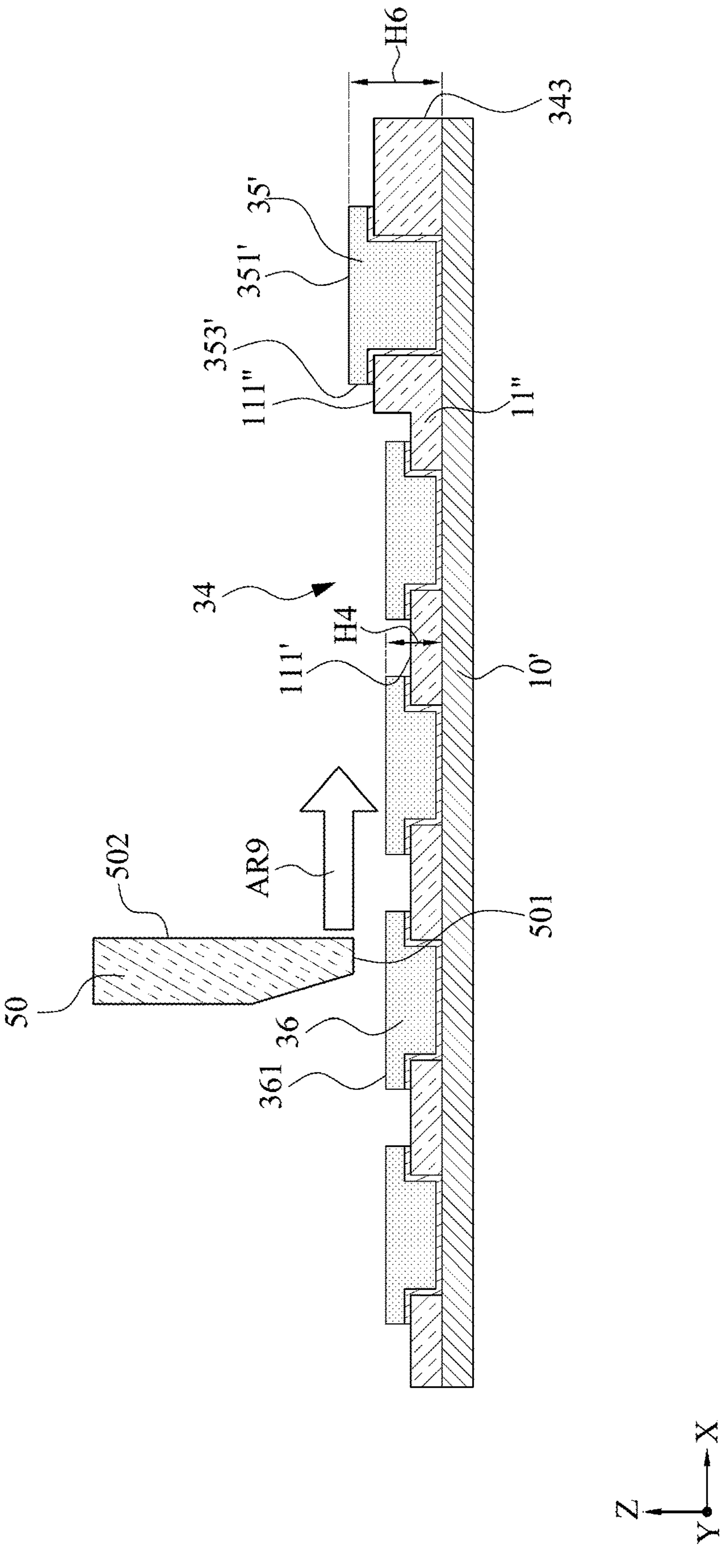
FIG. 37 illustrates one or more stages of an example of a testing method for a circuit pattern structure according to some embodiments of the present disclosure.

FIG. 37 illustrates one or more stages of an example of a testing method for a circuit pattern structure 200A according to some embodiments of the present disclosure. The circuit pattern structure 200A of FIG. 37 may be similar to the circuit pattern structure 100 of FIG. 1 and the difference therebetween is that the dielectric layer 11" may have a surface (or an upper surface) 111' at a first elevation and a surface (or an upper surface) 111" at a second elevation higher than the first elevation. The intact conductive trace 36 may be located at the first surface 111' and the under-test conductive trace 35' may be located at the second surface 111". The under-test conductive trace 35' may have a top surface 351' at an elevation (or height) H6 with respect to the carrier 10'. Owing to the higher surface 111" as compared to the surface 111', the height H6 may be higher than the height H4. The probe 50 be located at an elevation, such that the end 501 of the probe 50 is lower than the top surface 351' of the under-test conductive trace 35' but higher than a top surface 361 of the intact conductive trace 36. The probe 50 may have a movement AR9. The probe 50 may move toward the under-test conductive trace 35' in the movement AR9 and then push a lateral surface 353' the under-test conductive trace 35' until it is ruptured from the circuit pattern structure 200A. Since the end 501 of the probe 50 is spaced apart from the intact conductive traces 36, the probe 50 would not touch or damage the intact conductive trace 36, e.g., in the movement AR9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A measurement method, comprising:

providing a circuit pattern structure comprising a first pad and a second pad;

moving a probe across a first top surface of the first pad to contact the second pad, wherein the first pad is entirely non-overlapping with the second pad in a first direction perpendicular to a top surface of the circuit pattern structure; and applying a force, using the probe, to the second pad along a path overlapping a projecting area of the first pad on a surface of the circuit pattern structure.

2. The method of claim 1, wherein a first bottom surface of the first pad and a second bottom surface of the second pad are substantially coplanar with each other, and the first top surface of the first pad is at an elevation between an elevation of the second bottom surface of the second pad and an elevation of a second top surface of the second pad.

3. The method of claim 1, wherein the second pad has an interface between the second top surface and the second bottom surface of the second pad, wherein the interface is at the same elevation with the first top surface of the first pad.

4. The method of claim 1, wherein the circuit pattern structure comprises a first region and a second region, and wherein the first pad is located in the first region and the second pad in the second region, and wherein a pitch of the second region is greater than that of the first region, wherein the first region and the second region are non-overlapping with each other in a top view.

5. The method of claim 4, further comprising:

automatically identifying a width of a top surface of the second pad; and controlling an actuator of the probe to lower an end of the probe with a distance substantially equal to the width, such that the end of the probe is lower than the top surface of the second pad.

6. The method of claim 1, wherein the circuit pattern structure further comprises a dielectric layer having a first upper surface at a first elevation and a second upper surface at a second elevation higher than the first elevation, wherein the first upper surface connects the second upper surface through a lateral surface extending in the first direction, wherein the first pad is located at the first upper surface and the second pad is located at the second upper surface.

7. The method of claim 6, further comprising:

applying the force to a flat lateral surface of the second pad to rupture a portion of the dielectric layer surrounding the second pad.

8. The method of claim 1, wherein the second pad is disposed adjacent to an edge of the circuit pattern structure, and wherein an undercut is under an underside of the second pad.

9. The method of claim 1, further comprising:

lowering the probe based on recognition of a pattern having a sign of number, by a controller electrically connected to the probe, based on a library.

10. The method of claim 9, wherein the pattern is surrounded by a conductive trace connected to the second pad.

11. The method of claim 1, wherein providing the circuit pattern structure includes:

forming a dielectric layer;

forming the first pad at least partially in the dielectric layer;

forming the second pad adjacent to the first pad and having a height greater than that of the first pad; and forming an undercut from an underside of the second pad.

12. The method of claim 11, wherein forming the first pad includes forming two first pads; wherein forming the second pad adjacent to the first pad includes forming the second pad between the two first pads.

13. The method of claim 11, further comprising:

forming the second pad closer to an edge of the circuit pattern structure than the first pad is.

14. The method of claim 11, wherein the first pad and the second pad are formed in a same step of a process, wherein the second pad has an interface at the same elevation with the first top surface of the first pad.

15. The method of claim 11, further comprising:

forming a third pad simultaneously with forming the first pad; and wherein forming the second pad adjacent to the first pad includes forming the second pad over the third pad.

16. The method of claim 15, wherein the second pad has a thickness greater than that of the first pad.

17. A measurement method, comprising:

providing a circuit pattern structure comprising a first pad and a second pad having a height greater than that of the first pad;

moving a probe across a first top surface of the first pad to contact the second pad, wherein the first pad is entirely non-overlapping with the second pad in a first direction perpendicular to a top surface of the circuit pattern structure; and applying a force, using the probe, to the second pad along a path over the first pad to test a bonding quality of the first pad and the second pad in the circuit pattern structure.

18. The method of claim 17, wherein the bonding quality is defined as the force when the second pad is ruptured to have a new top surface having a roughness greater than that of the first top surface.

19. The method of claim 18, wherein the circuit pattern structure comprises a seed layer below the second pad and a dielectric layer under the seed layer, wherein the second pad has an interface above the seed layer and at the same elevation with the first top surface of the first pad, wherein the method further comprises:

when the seed layer is separated from the dielectric layer, checking whether a measured force is within a predetermined range.

20. The method of claim 17, further comprising:

automatically identifying a width of a top surface of the second pad;

controlling an actuator of the probe to lower an end of the probe with a distance substantially equal to the width; and obtaining a highest shear stress during a period that the probe is moved by the actuator to contact the second pad, wherein the bonding quality is determined by the highest shear stress, wherein a first bottom surface of the first pad and a second bottom surface of the second pad are substantially coplanar with each other, and the first top surface of the first pad is at an elevation between an elevation of the second bottom surface of the second pad and an elevation of a second top surface of the second pad.

* * * * *